(12) United States Patent  
Bathan et al.

(10) Patent No.: US 7,977,778 B2
(45) Date of Patent: Jul. 12, 2011

(54) INTEGRATED CIRCUIT PACKAGE SYSTEM WITH INTERFERENCE-FIT FEATURE

(75) Inventors: Henry Descalzo Bathan, Singapore (SG); Lionel Chien Hui Tay, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 5 days.

(21) Appl. No.: 11/744,697

(22) Filed: May 4, 2007

(65) Prior Publication Data

US 2008/0273312 A1 Nov. 6, 2008

(51) Int. Cl.
*H01L 23/02* (2006.01)
*H01L 23/04* (2006.01)
*H01L 23/29* (2006.01)

(52) U.S. Cl. ........ 257/678; 257/680; 257/698; 257/787; 257/788; 257/789; 257/795; 257/E23.116; 257/E23.124; 257/E23.168

(58) Field of Classification Search .............. 257/678, 257/680, 698, 787–789, 795, E23.116, E23.124, 257/E23.168
See application file for complete search history.

(56) References Cited

U.S. PATENT DOCUMENTS

| | | | |
|---|---|---|---|
| 4,581,680 A * | 4/1986 | Garner ........................ 361/768 |
| 4,987,473 A | 1/1991 | Johnson | |
| 5,814,885 A * | 9/1998 | Pogge et al. ................. 257/730 |
| 5,987,950 A * | 11/1999 | Horton ............................ 72/58 |
| 6,087,199 A * | 7/2000 | Pogge et al. ................. 438/106 |
| 6,114,221 A * | 9/2000 | Tonti et al. .................. 438/455 |
| 6,225,695 B1 * | 5/2001 | Chia et al. .................... 257/712 |
| 6,271,059 B1 * | 8/2001 | Bertin et al. ................. 438/109 |
| 6,333,553 B1 * | 12/2001 | Pogge ........................... 257/730 |
| 6,472,729 B1 | 10/2002 | Oka | |
| 6,643,434 B2 * | 11/2003 | Cayrefourcq et al. .......... 385/52 |
| 6,879,050 B2 * | 4/2005 | Thurgood et al. ............. 257/787 |
| 6,955,947 B2 | 10/2005 | Dias et al. | |
| 6,958,528 B2 | 10/2005 | Corisis | |
| 7,071,012 B2 * | 7/2006 | Tan et al. ........................ 438/14 |
| 7,309,623 B2 * | 12/2007 | Tan et al. ...................... 438/110 |
| 7,371,608 B2 * | 5/2008 | Tan et al. ...................... 438/109 |
| 7,479,692 B2 * | 1/2009 | Dimaano et al. .............. 257/676 |
| 7,556,987 B2 * | 7/2009 | Dimaano et al. .............. 438/123 |
| 7,588,999 B2 * | 9/2009 | Burghout et al. ............. 438/461 |
| 7,786,592 B2 * | 8/2010 | Trezza .......................... 257/777 |
| 2002/0011652 A1 * | 1/2002 | Pogge ........................... 257/668 |
| 2002/0096766 A1 * | 7/2002 | Chen et al. .................... 257/738 |
| 2003/0197290 A1 * | 10/2003 | Crowley et al. ............... 257/787 |
| 2004/0227217 A1 * | 11/2004 | Jang ............................... 257/676 |
| 2005/0121756 A1 * | 6/2005 | Chow et al. ................... 257/676 |
| 2005/0194698 A1 * | 9/2005 | Shim et al. .................... 257/784 |
| 2006/0038266 A1 * | 2/2006 | Song et al. .................... 257/676 |
| 2006/0175697 A1 * | 8/2006 | Kurosawa et al. ............ 257/686 |
| 2006/0238984 A1 * | 10/2006 | Belady et al. ................. 361/704 |
| 2006/0289967 A1 * | 12/2006 | Heck et al. .................... 257/621 |
| 2007/0075442 A1 * | 4/2007 | Krishnamoorthy et al. .. 257/797 |
| 2007/0109756 A1 * | 5/2007 | Park et al. ..................... 361/760 |
| 2007/0190694 A1 * | 8/2007 | Punzalan et al. .............. 438/123 |
| 2008/0111217 A1 * | 5/2008 | Dimaano et al. .............. 257/675 |
| 2008/0136045 A1 * | 6/2008 | Tan et al. ...................... 257/777 |
| 2009/0250798 A1 * | 10/2009 | Bathan et al. ................. 257/676 |
| 2010/0258925 A1 * | 10/2010 | Jeon et al. ..................... 257/676 |
| 2010/0264529 A1 * | 10/2010 | Punzalan et al. .............. 257/676 |

* cited by examiner

*Primary Examiner* — Ida M Soward
(74) *Attorney, Agent, or Firm* — Mikio Ishimaru

(57) ABSTRACT

An integrated circuit package system is provided including forming an integrated circuit die, forming an interference-fit feature in the integrated circuit die, fitting a support element within the interference-fit feature, connecting an external interconnect and the integrated circuit die, and encapsulating the integrated circuit die.

20 Claims, 15 Drawing Sheets

INTEGRATED CIRCUIT PACKAGE SYSTEM WITH INTERFERENCE-FIT FEATURE

TECHNICAL FIELD

The present invention relates generally to integrated circuit package system, and more particularly to integrated circuit package system with encapsulation.

BACKGROUND ART

Modern consumer electronics, such as cellular phones, digital cameras, and music players, are packing more integrated circuits into an ever shrinking physical space with expectations for decreasing cost. Numerous technologies have been developed to meet these requirements. Some of the research and development strategies focus on new technologies while others focus on improving the existing and mature technologies. Research and development in the existing technologies may take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality. Continued integration of functions into a single integrated circuit increases the integrated circuit size necessitating a more expensive package or a higher profile package.

Electronic products and integrated circuit inside are subjected to the full range of environments and conditions. This can span negative temperatures, triple digit temperatures, moisture, altitude, high force impacts and repetitive stress. Manufacturing methods need to accommodate both fabrication extremes as well as application or usage extremes. Stresses often result in damage to the integrated circuit package, such as delamination, corrosion, and breakage. This damage causes failures that are sometimes intermittent and hard to detect or analyze.

A variation of existing technologies uses integrated circuit packages with a die-attach paddle. Typically, integrated circuit die mounts on the die-attach paddle, wherein the die-attach paddle provides support and planar rigidity. Although conventional die-attach paddles provide functional utility, they create other problems. For example, the encapsulation may separate from the die-attach, such as epoxy molding compound (EMC) delamination, causing reliability problems, such as test failures in moisture sensitivity level (MSL) test. Another problem from conventional die-attach paddle also limits the reduction of the package height.

Thus, a need still remains for an integrated circuit package system providing low cost manufacturing, improved yield, and thinner profile for the integrated circuit package system. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming an integrated circuit die, forming an interference-fit feature in the integrated circuit die, fitting a support element within the interference-fit feature, connecting an external interconnect and the integrated circuit die, and encapsulating the integrated circuit die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
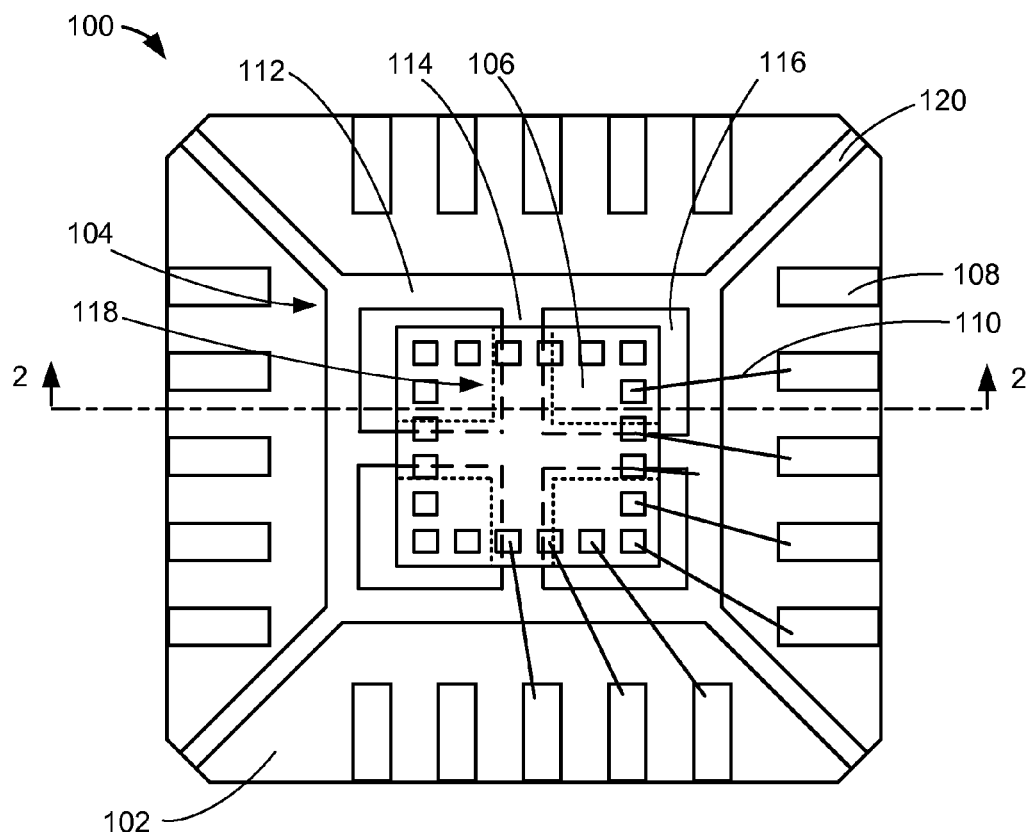
FIG. 1 is a plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a plan view of an integrated circuit package system 100 in a first embodiment of the present invention. The plan view depicts the integrated circuit package system 100 without a top portion of an encapsulation 102, such as an epoxy molding compound. The plan view depicts a paddle 104, an integrated circuit die 106, external interconnects 108, and internal interconnects 110. The internal interconnects 110 connect the integrated circuit die 106 and the external interconnects 108.

The paddle 104, such as a die-attach paddle, preferably includes a perimeter portion 112 and support elements 114. As an example, the perimeter portion 112 is shown in a rectangular ring geometric configuration. The support elements 114 are preferably orthogonal to each other and attached to the perimeter portion 112. For illustrative purposes, the paddle 104 is shown having the perimeter portion 112 as a contiguous portion, although it is understood that the perimeter portion 112 may not be contiguous, such as segments in the perimeter portion 112.

The paddle 104 has gaps 116 between the perimeter portion 112 and the support elements 114. The gaps 116 serve multiple functions. For example, the gaps 116 provide spaces for the integrated circuit die 106, to be described in more detail later. The paddle 104 having the gaps 116 function as mold locking features for reducing or eliminating delamination between the paddle 104 and the encapsulation 102. The mold locking features help to improve reliability of the integrated circuit package system 100 such as in moisture sensitivity level (MSL) test.

The integrated circuit die 106 mounts over and partially within the paddle 104. The support elements 114 are below the integrated circuit die 106 and partially nesting the integrated circuit die 106 within the gaps 116. The support elements 114 under the integrated circuit die 106 are depicted as dotted lines continuing from the support elements 114 not under the integrated circuit die 106.

The integrated circuit die 106 has interference-fit features 118, such as channels or grooves, allowing the support elements 114 to be partially nested within the integrated circuit die 106. The interference-fit features 118 are depicted as dotted lines under the integrated circuit die 106, wherein the dotted lines representing the interference-fit features 118 are wider than the dotted lines representing the support elements 114.

The integrated circuit die 106 preferably flexes or deforms allowing the support elements 114 to fit into the interference-fit features 118 without causing adverse damage to the integrated circuit die 106. For illustrative purposes, the integrated circuit die 106 is shown not overhanging the perimeter portion 112, although it is understood that the integrated circuit die 106 may overhang the perimeter portion 112.

The interference-fit features 118 preferably help secure the integrated circuit die 106 without requiring an adhesive (not shown), such as an epoxy adhesive, for mounting the integrated circuit die 106 over the support elements 114. Delamination is reduced or eliminated by the reduced surface area between the integrated circuit die 106 and the support elements 114 compared to an entire horizontal side of the integrated circuit die 106 in contact with the same surface area of another paddle (not shown) not having the perimeter portion 112, the support elements 114, and the gaps 116. The fitting, snap fitting, interference fitting, or resistance fitting of the integrated circuit die 106 and the support elements 114 reduce manufacturing complexity and cost in a number ways, such as eliminating the die-attach adhesive.

The internal interconnects 110, such a bond wires or ribbon bonds, connect the integrated circuit die 106 and the external interconnects 108, such as leads. Tie bars 120 extend from corners of the paddle 104. The encapsulation 102 outlines the boundary of the integrated circuit package system 100.

Figure 2:
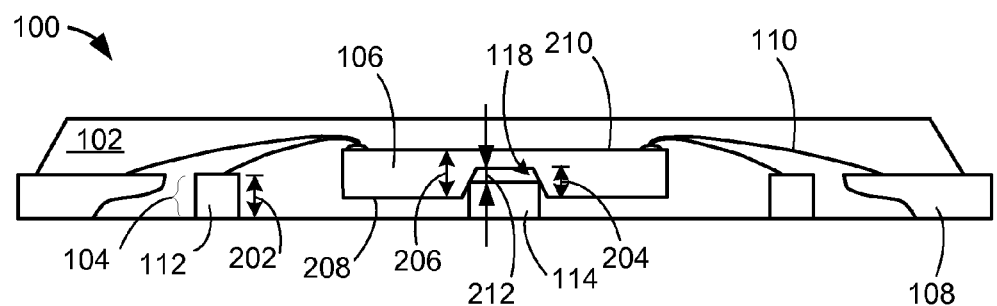
FIG. 2 is a cross-sectional view of the integrated circuit package system of FIG. 1 along line 2-2.

Referring now to FIG. 2, therein is shown a cross-sectional view of the integrated circuit package system 100 of FIG. 1 along line 2-2. The cross-sectional view depicts the paddle 104 having a paddle height 202. The integrated circuit die 106 is shown partially nested within the paddle 104 by a fitting depth 204 of the interference-fit features 118.

The integrated circuit die 106 has a thickness 206 and the fitting depth 204 is preferably less than the thickness 206. The interference-fit features 118 preferably do not traverse between a non-active side 208 and an active side 210 of the integrated circuit die 106. The partially nesting of the integrated circuit die 106 within the paddle 104 allows for a lower profile or lower height of the integrated circuit package system 100.

The cross-sectional view also depicts the integrated circuit die 106 over the support elements 114 and within the perimeter portion 112. The interference-fit features 118 may be formed with different geometric configurations. For example, the interference-fit features 118 are shown as an angled geometric configuration with the wider portion of the interference-fit features 118 is at the non-active side 208. A clearance 212 is preferably between the integrated circuit die 106 in the interference-fit features 118 and the support elements 114. The encapsulation 102 preferably fills the clearance 212.

For illustrative purposes, the perimeter portion 112 and the support elements 114 are shown similar or substantially the same height as the external interconnects 108, although it is understood that the perimeter portion 112, the support elements 114, and the external interconnects 108 may have different heights. For example, the perimeter portion 112 and the support elements 114 having similar or substantially the same height may be exposed by the encapsulation 102. Another example, the perimeter portion 112 and the support elements 114 may be partially etched such that the perimeter portion 112 and the support elements 114 are within the encapsulation 102.

The internal interconnects 110 preferably connect the integrated circuit die 106 with both the paddle 104 and the external interconnects 108. The encapsulation 102 covers the integrated circuit die 106 and the internal interconnects 110. The encapsulation 102 partially covers and exposes the external interconnects 108 and the paddle 104 to ambient. For illustrative purposes, the encapsulation 102 is shown exposing the paddle 104, although it is understood that the paddle 104 may not be exposed.

Figure 3:
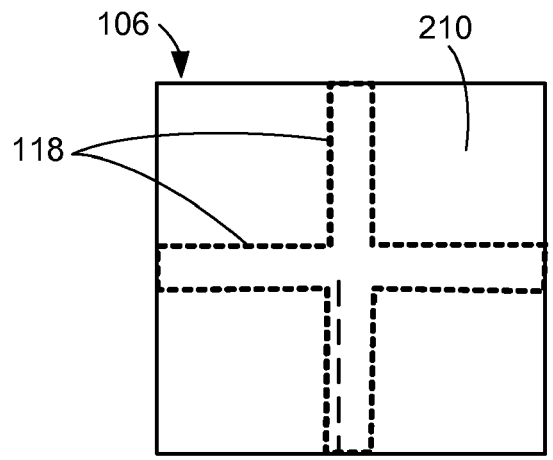
FIG. 3 is a top view of the integrated circuit die of FIG. 1.

Referring now to FIG. 3, therein is shown a top view of the integrated circuit die 106 of FIG. 1. The top view depicts the active side 210 of the integrated circuit die 106. The dotted lines preferably represent the interference-fit features 118 at the non-active side 208 of FIG. 2 and not traversing to the active side 210.

Figure 4:
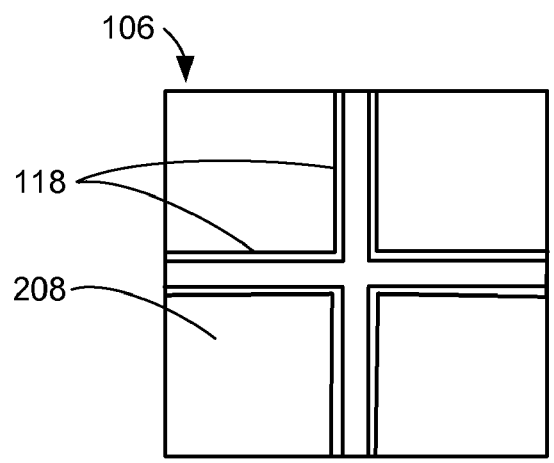
FIG. 4 is a bottom view of the integrated circuit die of FIG. 1.

Referring now to FIG. 4, therein is shown a bottom view of the integrated circuit die 106 of FIG. 1. The bottom view depicts the non-active side 208 of the integrated circuit die 106 and the interference-fit features 118 from the non-active side 208. The interference-fit features 118 are shown in an orthogonal and complementary geometric configuration to the support elements 114 of FIG. 1 of the paddle 104 of FIG. 1 such that the support elements 114 fit into the interference-fit features 118.

Figure 5:
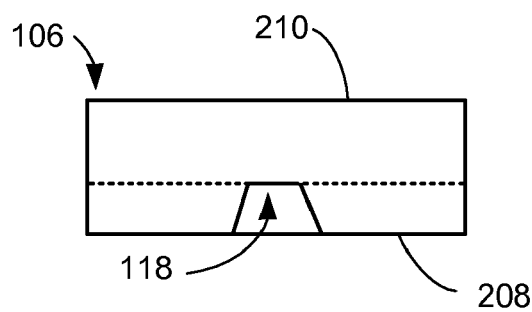
FIG. 5 is a side view of the integrated circuit die of FIG. 1.

Referring now to FIG. 5, therein is shown a side view of the integrated circuit die 106 of FIG. 1. The side view depicts a portion of the interference-fit features 118 as a recess from the non-active side 208 and not traversing to the active side 210. Dotted lines representing the orthogonal portion of the interference-fit features 118 to the portion shown by the side view. As an example, the interference-fit features 118 are shown in an angled geometric configuration with the wider portion at the non-active side 208 than the portion within the integrated circuit die 106.

Figure 6:
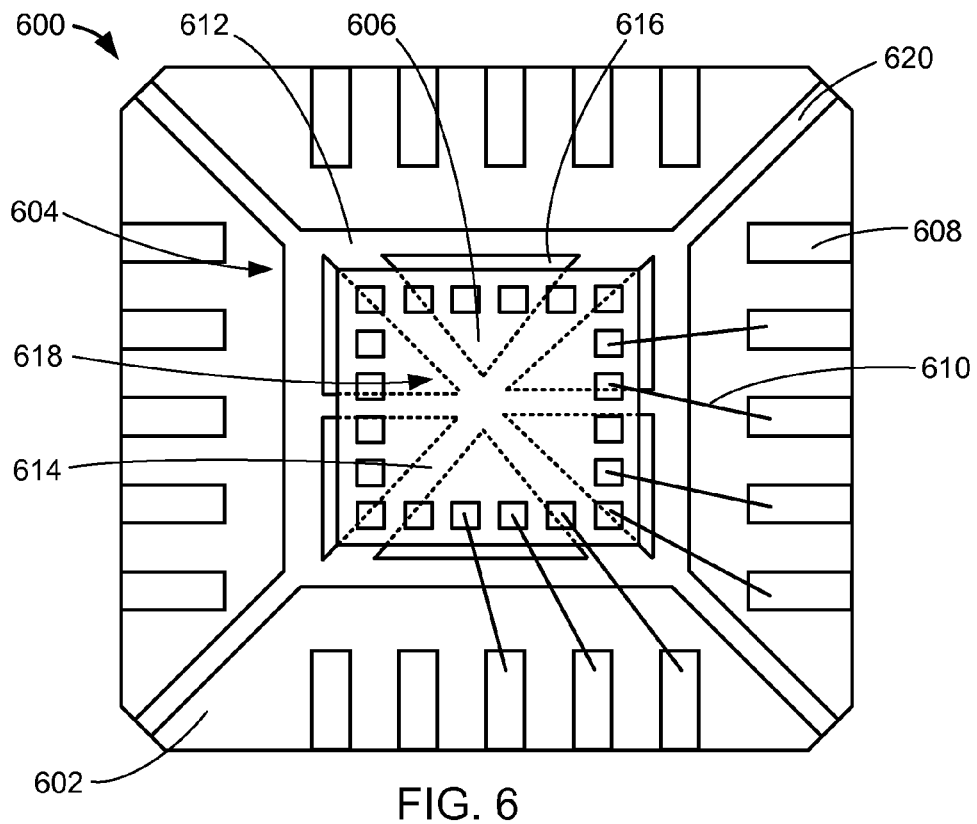
FIG. 6 is a plan view of an integrated circuit package system in a second embodiment of the present invention.

Referring now to FIG. 6, therein is shown a plan view of an integrated circuit package system 600 in a second embodiment of the present invention. The plan view depicts the integrated circuit package system 600 without a top portion of an encapsulation 602, such as an epoxy molding compound. The plan view depicts a paddle 604, an integrated circuit die 606, external interconnects 608, and internal interconnects 610. The internal interconnects 610 connect the integrated circuit die 606 and the external interconnects 608.

The paddle 604, such as a die-attach paddle, preferably includes a perimeter portion 612 and support elements 614. As an example, the perimeter portion 612 is shown in a rectangular ring geometric configuration with the support elements 614 preferably obtuse to each other and attached to the perimeter portion 612. The support elements 614 are shown in a star or asterisk like geometric configuration. For illustrative purposes, the paddle 604 is shown having the perimeter portion 612 as a contiguous portion, although it is understood that the perimeter portion 612 may not be contiguous, such as segments in the perimeter portion 612.

The paddle 604 has gaps 616 between the perimeter portion 612 and the support elements 614. The gaps 616 serve multiple functions. For example, the gaps 616 provide spaces for the integrated circuit die 606. The paddle 604 having the gaps 616 function as mold locking features for reducing or eliminating delamination between the paddle 604 and the encapsulation 602. The mold locking features help to improve reliability of the integrated circuit package system 600 such as in moisture sensitivity level (MSL) test.

The integrated circuit die 606 mounts over and partially within the paddle 604. The support elements 614 are below the integrated circuit die 606 and partially nesting the integrated circuit die 606 within the gaps 616. The integrated circuit die 606 has interference-fit features 618, such as channels or grooves, represented by dotted lines that allow the support elements 614 to be partially nested within the integrated circuit die 606. The integrated circuit die 606 preferably flexes or deforms allowing the support elements 614 to fit into the interference-fit features 618 without causing adverse damage to the integrated circuit die 606. For illustrative purposes, the integrated circuit die 606 is shown not overhanging the perimeter portion 612, although it is understood that the integrated circuit die 606 may overhang the perimeter portion 612.

The interference-fit features 618 preferably help secure the integrated circuit die 606 without requiring an adhesive (not shown), such as an epoxy adhesive, for mounting the integrated circuit die 606 over the support elements 614. Delamination is reduced or eliminated by the reduced surface area between the integrated circuit die 606 and the support elements 614 compared to an entire horizontal side of the integrated circuit die 606 in contact with the same surface area of another paddle (not shown) not having the perimeter portion 612, the support elements 614, and the gaps 616. The fitting or snap fitting of the integrated circuit die 606 and the support elements 614 reduces manufacturing complexity and cost in a number ways, such as eliminating the die-attach adhesive.

The internal interconnects 610, such a bond wires or ribbon bonds, connect the integrated circuit die 606 and the external interconnects 608, such as leads. Tie bars 620 extend from corners of the paddle 604. The encapsulation 602 outlines the boundary of the integrated circuit package system 600.

Figure 7:
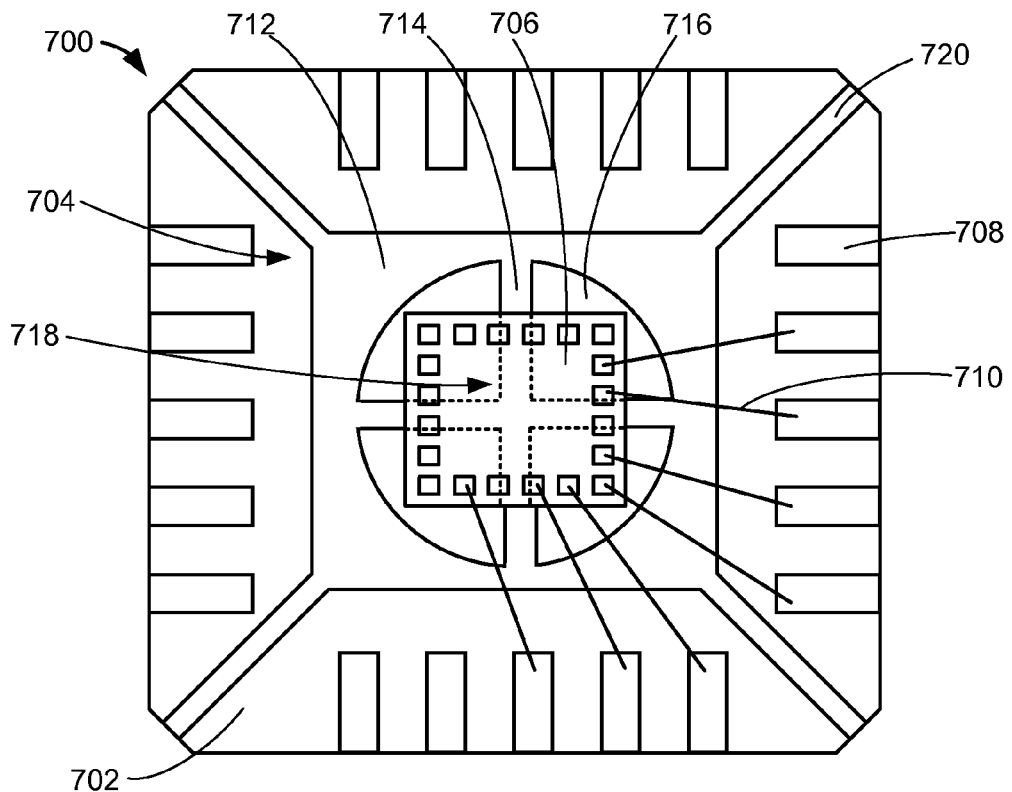
FIG. 7 is a plan view of an integrated circuit package system in a third embodiment of the present invention.

Referring now to FIG. 7, therein is shown a plan view of an integrated circuit package system 700 in a third embodiment of the present invention. The plan view depicts the integrated circuit package system 700 without a top portion of an encapsulation 702, such as an epoxy molding compound. The plan view depicts a paddle 704, an integrated circuit die 706, external interconnects 708, and internal interconnects 710. The internal interconnects 710 connect the integrated circuit die 706 and the external interconnects 708.

The paddle 704, such as a die-attach paddle, preferably includes a perimeter portion 712 and support elements 714. As an example, the perimeter portion 712 is shown in a geometric configuration with a rectangular perimeter and a circular interior with the support elements 714 preferably orthogonal to each other and attached to the perimeter portion 712. For illustrative purposes, the paddle 704 is shown having the perimeter portion 712 as a contiguous portion, although it is understood that the perimeter portion 712 may not be contiguous, such as segments in the perimeter portion 712.

The paddle 704 has gaps 716 between the perimeter portion 712 and the support elements 714. The gaps 716 serve multiple functions. For example, the gaps 716 provide spaces for the integrated circuit die 706. The paddle 704 having the gaps 716 function as mold locking features for reducing or eliminating delamination between the paddle 704 and the encapsulation 702. The mold locking features help to improve reliability of the integrated circuit package system 700 such as in moisture sensitivity level (MSL) test.

The integrated circuit die 706 mounts over and partially within the paddle 704. The support elements 714 are below the integrated circuit die 706 and partially nesting the integrated circuit die 706 within the gaps 716. The integrated circuit die 706 has interference-fit features 718, such as channels or grooves, represented by dotted lines that allow the support elements 714 to be partially nested within the integrated circuit die 706. The integrated circuit die 706 preferably flexes or deforms allowing the support elements 714 to fit into the interference-fit features 718 without causing adverse damage to the integrated circuit die 706.

For illustrative purposes, the integrated circuit die 706 is shown within the circular interior of the perimeter portion 712, although it is understood that the integrated circuit die 706 may extend over the circular interior or over the perimeter portion 712. Also for illustrative purposes, the integrated circuit die 706 is shown not overhanging the perimeter portion 712, although it is understood that the integrated circuit die 706 may overhang the perimeter portion 712.

The interference-fit features 718 preferably help secure the integrated circuit die 706 without requiring an adhesive (not shown), such as an epoxy adhesive, for mounting the integrated circuit die 706 over the support elements 714. Delamination is reduced or eliminated by the reduced surface area between the integrated circuit die 706 and the support elements 714 compared to an entire horizontal side of the integrated circuit die 706 in contact with the same surface area of another paddle (not shown) not having the perimeter portion 712, the support elements 714, and the gaps 716. The fitting or snap fitting of the integrated circuit die 706 and the support elements 714 reduces manufacturing complexity and cost in a number ways, such as eliminating the die-attach adhesive.

The internal interconnects 710, such a bond wires or ribbon bonds, connect the integrated circuit die 706 and the external interconnects 708, such as leads. Tie bars 720 extend from corners of the paddle 704. The encapsulation 702 outlines the boundary of the integrated circuit package system 700.

Figure 8:
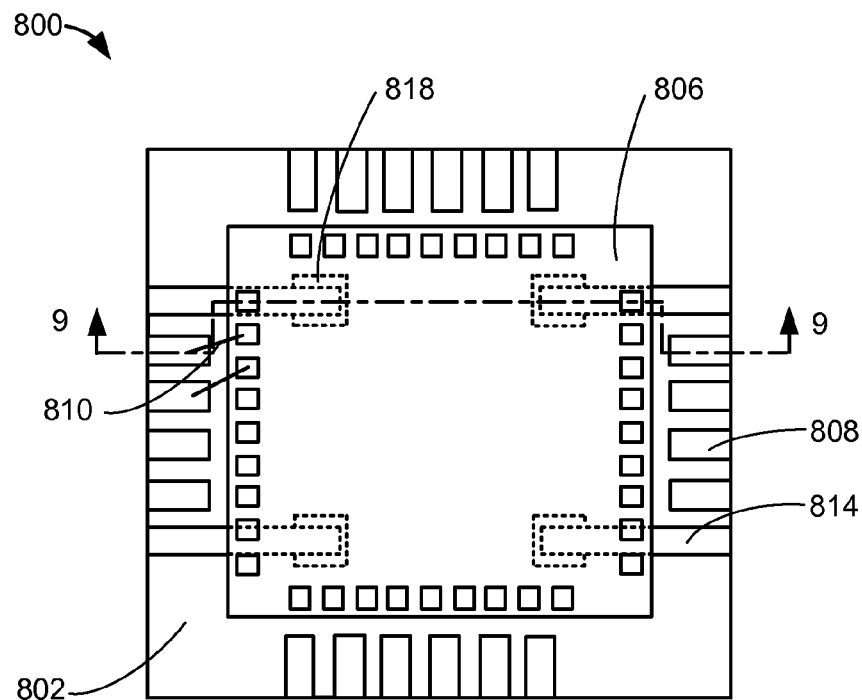
FIG. 8 is a plan view of an integrated circuit package system in a fourth embodiment of the present invention.

Referring now to FIG. 8, therein is shown a plan view of an integrated circuit package system 800 in a fourth embodiment of the present invention. The plan view depicts the integrated circuit package system 800 without a top portion of an encapsulation 802, such as an epoxy molding compound. The plan view depicts an integrated circuit die 806, support elements 814, external interconnects 808, and internal interconnects 810. The internal interconnects 810 connect the integrated circuit die 806 and the external interconnects 808. The plan view also depicts the integrated circuit package system 800 as padless or not having a paddle (not shown).

The integrated circuit die 806 mounts over the support elements 814, such as extended leads. The support elements 814 are below the integrated circuit die 806 and partially nesting in the integrated circuit die 806. The integrated circuit die 806 has interference-fit features 818, such as recesses or grooves, represented by dotted lines that allow the support elements 814 to be partially nested within the integrated circuit die 806.

The interference-fit features 818 preferably help secure the integrated circuit die 806 without requiring an adhesive (not shown), such as an epoxy adhesive, for mounting the integrated circuit die 806 over the support elements 814. Delamination is reduced or eliminated by the reduced surface area between the integrated circuit die 806 and the support elements 814 compared to an entire horizontal side of the integrated circuit die 806 in contact with the same surface area of a paddle (not shown). The fitting or snap fitting of the integrated circuit die 806 and the support elements 814 reduces manufacturing complexity and cost in a number ways, such as eliminating the die-attach adhesive.

For illustrative purposes, the interference-fit features 818 are shown substantially the same, although it is understood that the interference-fit features 818 may be different, such as different sizes or at different locations of the integrated circuit die 806. Also for illustrative purposes, the support elements 814 are shown substantially the same, although it is understood that the support elements 814 may be different, such as different sizes or lengths.

The internal interconnects 810, such a bond wires or ribbon bonds, connect the integrated circuit die 806 and the external interconnects 808, such as leads. The encapsulation 802 outlines the boundary of the integrated circuit package system 800.

Figure 9:
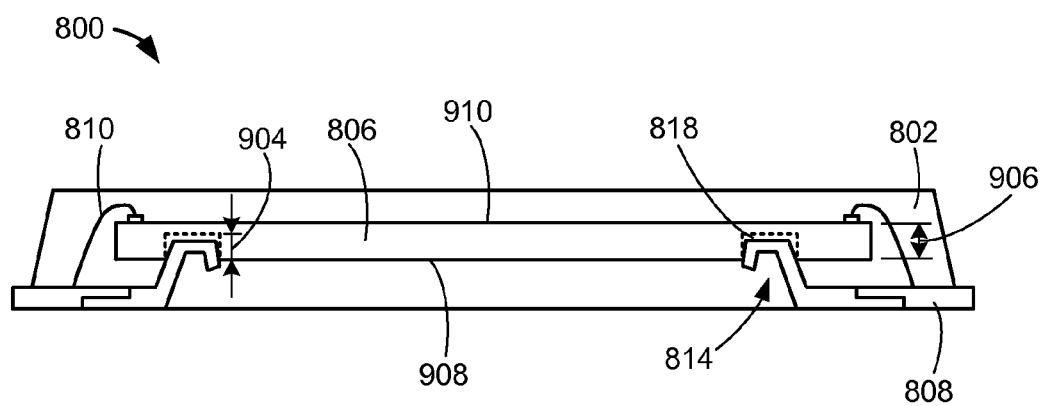
FIG. 9 is a cross-sectional view of the integrated circuit package system of FIG. 8 along line 9-9.

Referring now to FIG. 9, therein is shown is a cross-sectional view of the integrated circuit package system 800 of FIG. 8 along line 8-8. The cross-sectional view depicts the integrated circuit die 806 is shown partially nesting the support elements 814 by a fitting depth 904 of the interference-fit features 818. The integrated circuit die 806 preferably flexes or deforms allowing the support elements 814 to fit into the interference-fit features 818 without causing adverse damage to the integrated circuit die 806. The interference-fit features 818 are depicted by dotted lines. The support elements 814 preferably further extend towards center or interior of the integrated circuit package system 800 than the external interconnects 808.

The integrated circuit die 806 has a thickness 906 and the fitting depth 904 is preferably less than the thickness 906. The interference-fit features 818 preferably do not traverse between a non-active side 908 and an active side 910 of the integrated circuit die 806. The partially nesting of the support elements 814 within the integrated circuit die 806 allows for a lower profile or lower height of the integrated circuit package system 800.

The internal interconnects 810 preferably connect the integrated circuit die 806 and the external interconnects 808. The encapsulation 802 covers the integrated circuit die 806 and the internal interconnects 810. The encapsulation 802 partially covers and exposes the external interconnects 808 and the support elements 814 to ambient.

For illustrative purposes, the encapsulation 802 is shown exposing the support elements 814, although it is understood that the support elements 814 may not be exposed. For example, the support elements 814 may be partially or half etched such that the encapsulation 802 does not expose the support elements 814.

Figure 10:
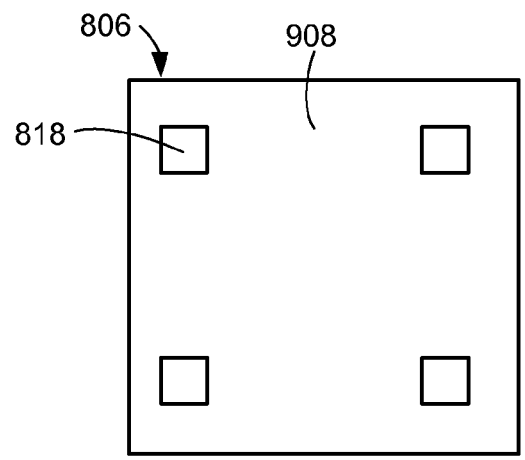
FIG. 10 is a bottom view of the integrated circuit die of FIG. 9.

Referring now to FIG. 10, therein is shown a bottom view of the integrated circuit die 806 of FIG. 9. The bottom view depicts the interference-fit features 818 as rectangular recesses from the non-active side 908 proximate corners of the integrated circuit die 806.

For illustrative purposes, the interference-fit features 818 are shown as rectangular recesses, although it is understood that the interference-fit features 818 may be formed in different configurations, such as circular recesses. Also for illustrative purposes, the interference-fit features 818 are shown proximate the corners of the integrated circuit die 806, although it is understood that the interference-fit features 818 may be located at other locations of the integrated circuit die 806, such as at the center or distributed not at the corners.

Figure 11:
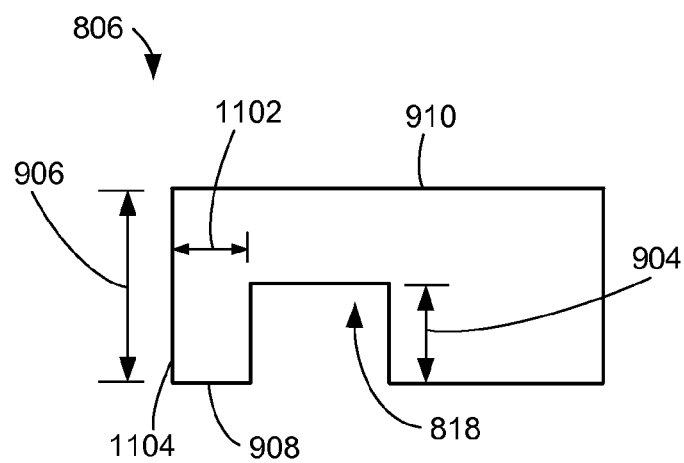
FIG. 11 is a more detailed cross-sectional view of one of the interference-fit features of the integrated circuit die of FIG. 9.

Referring now to FIG. 11, therein is shown a more detailed cross-sectional view of one of the interference-fit features 818 of the integrated circuit die 806 of FIG. 9. The more detailed cross-sectional view depicts one of the interference-fit features 818 having the fitting depth 904 from the non-active side 908. The fitting depth 904 is preferably less than the thickness 906 of the integrated circuit die 806. The interference-fit features 818 preferably do not traverse from the non-active side 908 through the active side 910. The interference-fit features 818 are placed a distant 1102 from an edge 1104 of the integrated circuit die 806 ensuring structural rigidity of the integrated circuit die 806.

Figure 12:
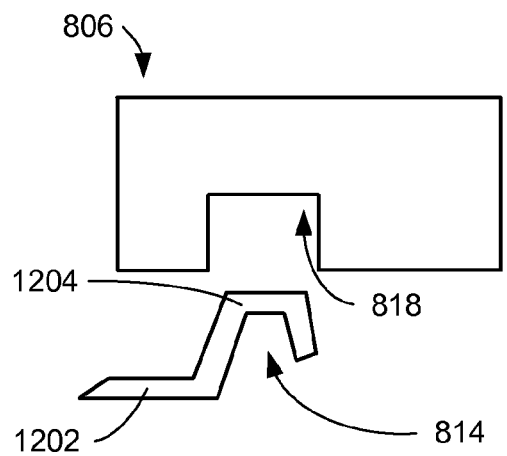
FIG. 12 is a more detailed cross-sectional view of one of the interference-fit features of the integrated circuit die over one of the support elements of FIG. 9.

Referring now to FIG. 12, therein is shown a more detailed cross-sectional view of one of the interference-fit features 818 of the integrated circuit die 806 over one of the support elements 814 of FIG. 9. The cross-sectional view depicts a portion of the integrated circuit die 806 with one of the interference-fit features 818 over a portion of one of the support elements 814.

The support elements 814 preferably have a planar portion 1202 and a locking portion 1204. The locking portion 1204 is preferably an elevated portion that has a bend that fits into the interference-fit features 818. The locking portion 1204 is shown aligned below the interference-fit features 818.

Figure 13:
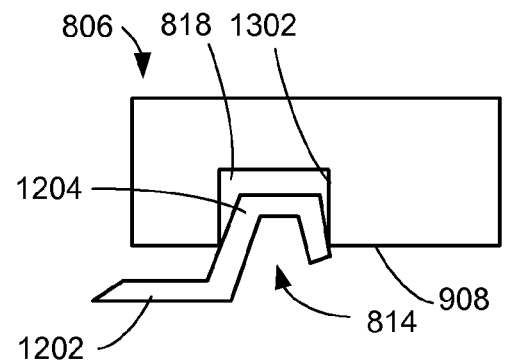
FIG. 13 is a more detailed cross-sectional view of one the interference-fit features of the integrated circuit die with one of the support elements therein of FIG. 9.

Referring now to FIG. 13, therein is shown a more detailed cross-sectional view of one the interference-fit features 818 of the integrated circuit die 806 with one of the support elements 814 therein of FIG. 9. The cross-sectional view depicts the locking portion 1204 placed within the interference-fit features 818. For example, the integrated circuit die 806 preferably flexes or deforms allowing the support elements 814 to fit into the interference-fit features 818 without causing adverse damage to the integrated circuit die 806. Another example, the locking portion 1204 may have a compression resilient bend such that sides of the locking portion 1204 press against the interference-fit features 818. The planar portion 1202 is shown coplanar with the non-active side 908.

Figure 14:
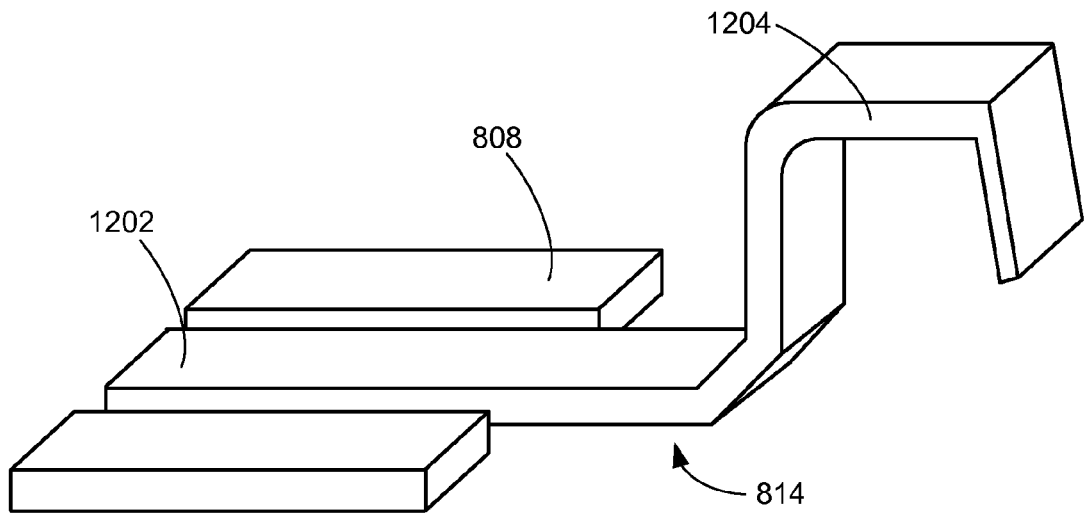
FIG. 14 is an isometric view of one of the support elements of FIG. 9.

Referring now to FIG. 14, therein is shown an isometric view of one of the support elements 814 of FIG. 9. The isometric view depicts one of the support elements 814 between the external interconnects 808, such as leads. The planar portion 1202 of the support elements 814 may or may not be coplanar to the external interconnects 808. The locking portion 1204 preferably has the resilient bend for providing a secure and non-adhesive fit into the interference-fit features 818 of FIG. 13.

Figure 15:
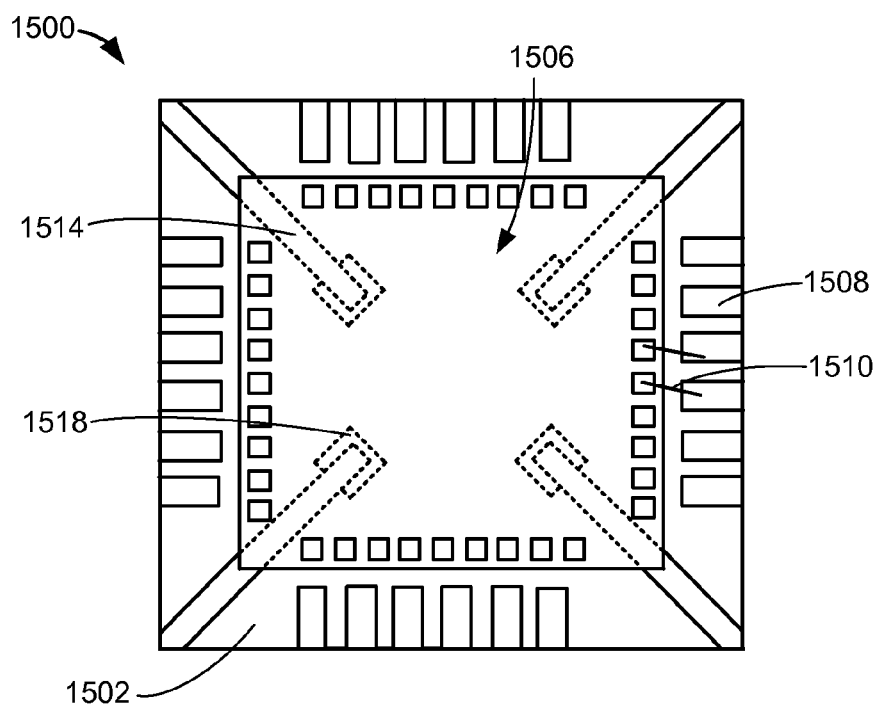
FIG. 15 is a plan view of an integrated circuit package system in a fifth embodiment of the present invention.

Referring now to FIG. 15, therein is shown a plan view of an integrated circuit package system 1500 in a fifth embodiment of the present invention. The plan view depicts the integrated circuit package system 1500 without a top portion of an encapsulation 1502, such as an epoxy molding compound. The plan view depicts an integrated circuit die 1506, support elements 1514, external interconnects 1508, and internal interconnects 1510. The internal interconnects 1510 connect the integrated circuit die 1506 and the external interconnects 1508. The plan view also depicts the integrated circuit package system 1500 as padless or not having a paddle (not shown).

The integrated circuit die 1506 mounts over the support elements 1514 such as extended tie bars or from corners of the integrated circuit package system 1500. The support elements 1514 are below the integrated circuit die 1506 and partially nesting in the integrated circuit die 1506. The integrated circuit die 1506 has interference-fit features 1518, such as recesses or grooves, represented by dotted lines that allow the support elements 1514 to be partially nested within the integrated circuit die 1506.

The interference-fit features 1518 preferably help secure the integrated circuit die 1506 without requiring an adhesive (not shown), such as an epoxy adhesive, for mounting the integrated circuit die 1506 over the support elements 1514. Delamination is reduced or eliminated by the reduced surface area between the integrated circuit die 1506 and the support elements 1514 compared to an entire horizontal side of the integrated circuit die 1506 in contact with the same surface area of a paddle (not shown). The fitting or snap fitting of the integrated circuit die 1506 and the support elements 1514 reduces manufacturing complexity and cost in a number ways, such as eliminating the die-attach adhesive.

For illustrative purposes, the interference-fit features 1518 are shown substantially the same, although it is understood that the interference-fit features 1518 may be different, such as different sizes, at different locations of the integrated circuit die 1506 or at different angles relative to the perimeter of the integrated circuit die 1506. Also for illustrative purposes, the support elements 1514 are shown substantially the same, although it is understood that the support elements 1514 may be different, such as different sizes or lengths.

The internal interconnects 1510, such a bond wires or ribbon bonds, connect the integrated circuit die 1506 and the external interconnects 1508, such as leads. The encapsulation 1502 outlines the boundary of the integrated circuit package system 1500.

Figure 16:
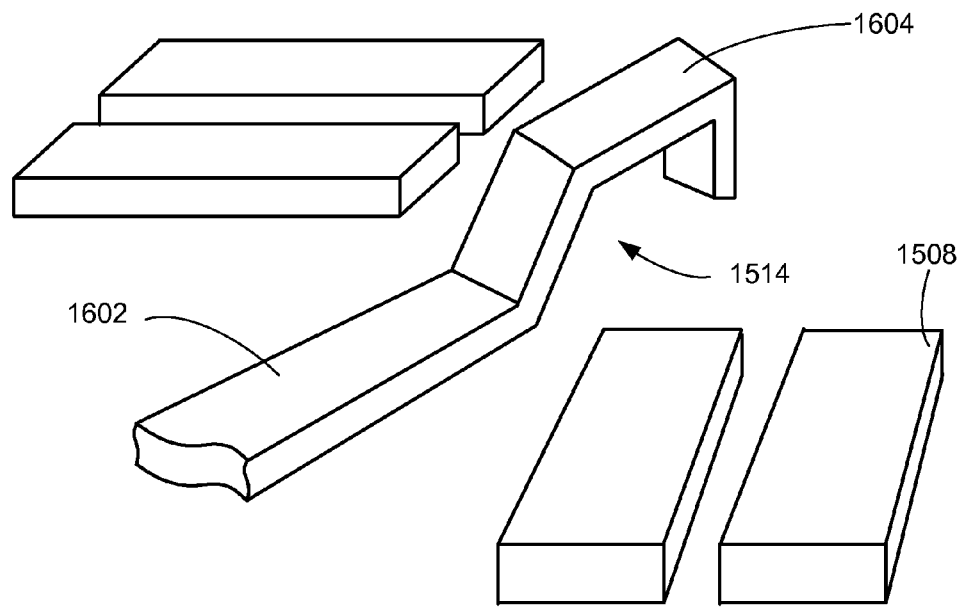
FIG. 16 is an isometric view of one of the support elements of FIG. 15.

Referring now to FIG. 16, therein is shown an isometric view of one of the support elements 1514 of FIG. 15. The isometric view depicts one of the support elements 1514 at a corner of the integrated circuit package system 1500 of FIG. 15 and between the external interconnects 1508, such as leads. A planar portion 1602 of the support elements 1514 may or may not be coplanar to the external interconnects 1508. The support elements 1514 may be partially or half-etched such that the encapsulation 1502 of FIG. 15 does not expose the support elements 1514 to ambient.

For example, the integrated circuit die 1506 preferably flexes or deforms allowing the support elements 1514 to fit into the interference-fit features 1518 without causing adverse damage to the integrated circuit die 1506. Another example, a locking portion 1604 of the support elements 1514 preferably has the resilient bend for providing a secure and adhesiveless fit into the interference-fit features 1518 of FIG. 15.

Figure 17:
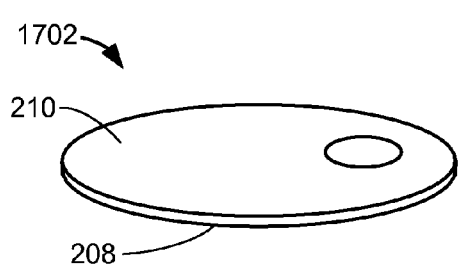
FIG. 17 is a perspective view of a wafer.

Referring now to FIG. 17, therein is shown a perspective view of a wafer 1702. The perspective view depicts an integrated circuit die, such as the integrated circuit die 106 of FIG. 1, highlighted by an ellipse over the active side 210 of the wafer 1702. The wafer 1702 may have undergone a thinning process along the non-active side 208 of the wafer 1702.

Figure 18:
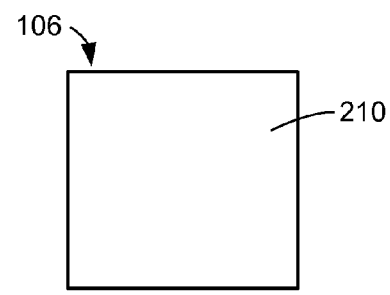
FIG. 18 is a top view of the integrated circuit die from the wafer of FIG. 17.

Referring now to FIG. 18, therein is shown a top view of the integrated circuit die 106 from the wafer 1702 of FIG. 17. The top view depicts the active side 210 having circuitry fabricated thereon. The interference-fit features 118 of FIG. 2 are preferably not shown from the active side 210.

Figure 19:
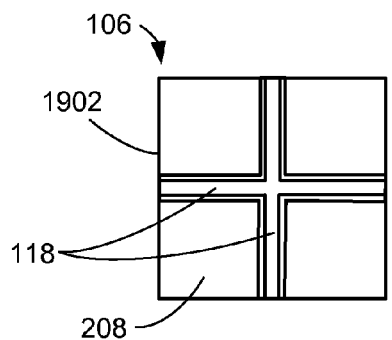
FIG. 19 is a bottom view of the integrated circuit die of FIG. 18.

Referring now to FIG. 19, therein is shown a bottom view of the integrated circuit die 106 of FIG. 18. The bottom view depicts the non-active side 208 of the integrated circuit die 106 and the interference-fit features 118 from the non-active side 208. The interference-fit features 118 are shown as orthogonal grooves or recesses from edges 1902 of the integrated circuit die 106. The configuration of the interference-fit features 118 is a complementary geometric configuration to the support elements 114 of FIG. 1 of the paddle 104 of FIG. 1 such that the support elements 114 fit into the interference-fit features 118.

Figure 20:
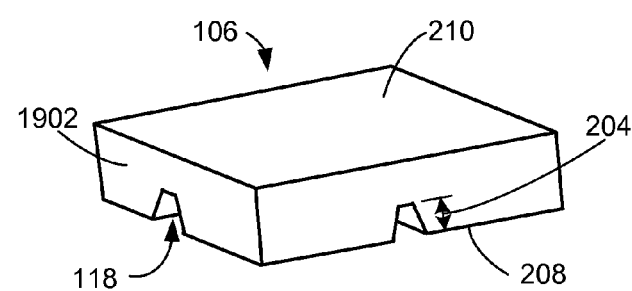
FIG. 20 is an isometric view of the integrated circuit die of FIG. 18.

Referring now to FIG. 20, therein is shown an isometric view of the integrated circuit die 106 of FIG. 18. The isometric view depicts the interference-fit features 118 from the edges 1902 of the integrated circuit die 106. As described earlier, the interference-fit features 118 are preferably formed from the non-active side 208 and not traversing to the active side 210.

The interference-fit features 118 may be formed by different processes. For example, the interference-fit features 118 may be formed at the wafer level or locally formed with the integrated circuit die 106. Another example, the interference-fit features 118 may be formed with laser ablation, partial cut saw, partial cut drill, or half etching.

The interference-fit features 118 may have structural variations for forming the non-adhesive fit and structural robustness avoiding cracking, chipping, or other damage from the secure fit of the support elements 114 of FIG. 1 into the interference-fit features 118. For example, the interference-fit features 118 may be formed to the fitting depth 204 such that the integrated circuit die 106 mounts securely over the support elements 114. Another example, the interference-fit features 118 may be formed with ridges (not shown) therein for providing grip with the support elements 114. Yet another example, the interference-fit features 118, the non-active side 208, or a combination thereof may be coated with a non-adhesive, such as a plastic layer, for providing a secure fit between the support elements 114 and the integrated circuit die 106 without damage.

Figure 21:
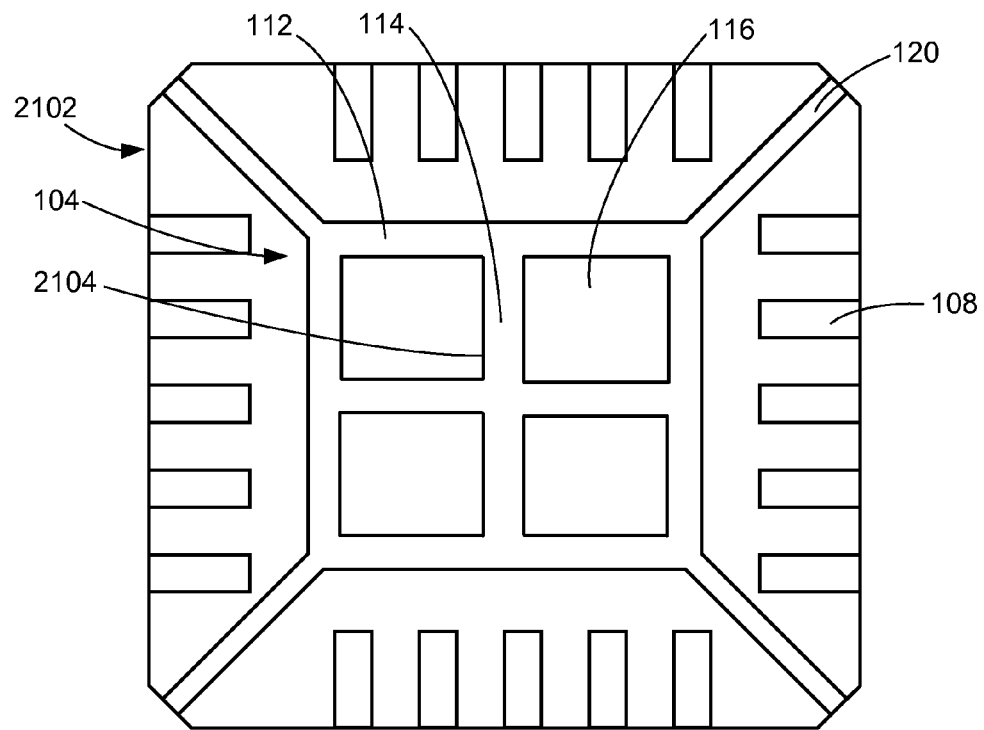
FIG. 21 is a top view of a portion of a lead frame.

Referring now to FIG. 21, therein is shown a top view of a portion of a lead frame 2102. The top view depicts the external interconnects 108, the tie bars 120, and the paddle 104. The paddle 104 preferably includes the perimeter portion 112 and the support elements 114, wherein the support elements 114 are orthogonal to each other. The gaps 116 are preferably between the perimeter portion 112 and the support elements 114.

The paddle 104 having the perimeter portion 112, the support elements 114, and the gaps 116 therein may be form by different processes. For example, the paddle 104 may be formed by stamping the gaps 116 into the paddle 104 forming the perimeter portion 112 and the support elements 114. Another example, the perimeter portion 112 and the support elements 114 may be formed by etching the gaps 116 through the paddle 104.

The support elements 114 may have structural variations for forming the non-adhesive fit with the integrated circuit die 106 of FIG. 20 without damage to the integrated circuit die 106. For example, the support elements 114 may be formed with ridges (not shown) along sides 2104 of the support elements 114. The ridges may provide grip for the interference-fit features 118 of FIG. 20 of the integrated circuit die 106. Another example, the sides 2104 of the support elements 114 may be coated with a non-adhesive, such as a plastic layer, for providing a secure fit between the support elements 114 and the integrated circuit die 106 without damaging the integrated circuit die 106.

Figure 22:
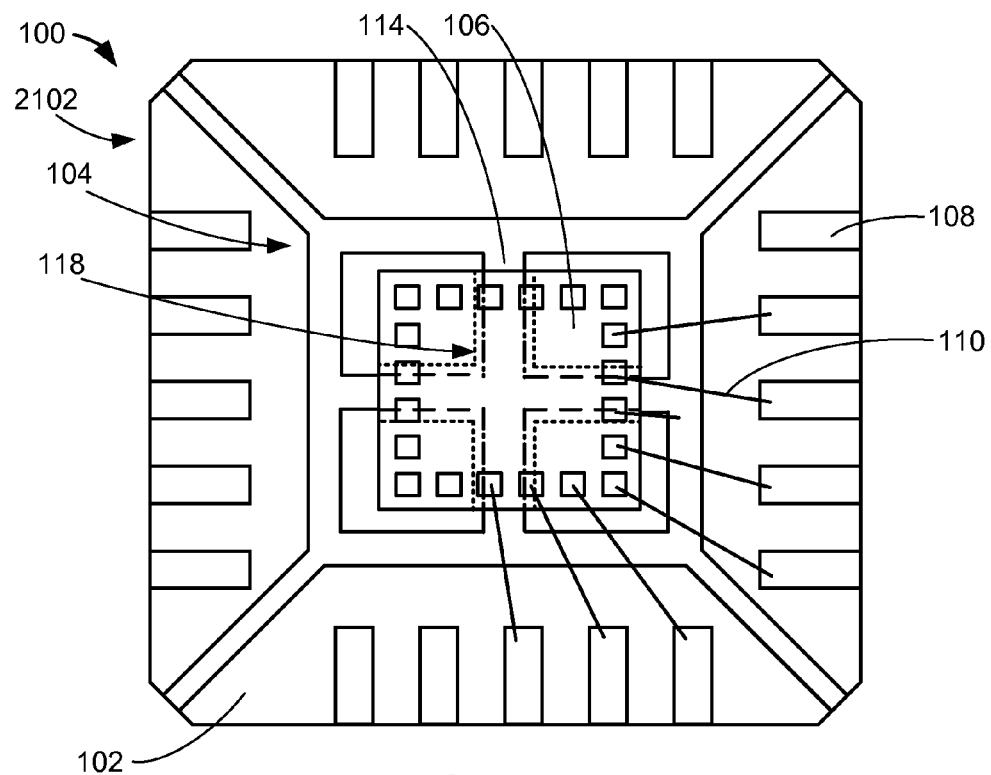
FIG. 22 is a top view of the lead frame in a mounting phase of the integrated circuit die.

Referring now to FIG. 22, therein is shown a top view of the lead frame 2102 in a mounting phase of the integrated circuit die 106. The integrated circuit die 106 is mounted over and within the paddle 104. The support elements 114 are nested or partially nested in the interference-fit features 118. The interference-fit features 118 are depicted by dotted lines.

The internal interconnects 110 connect the integrated circuit die 106 and the external interconnects 108. A molding process forms the encapsulation 102. The structural features of the interference-fit features 118, the support elements 114, or the combination thereof described earlier hold the integrated circuit die 106 in place withstanding the molding process. The lead frame 2102 with the encapsulation 102 undergoes singulation forming the integrated circuit package system 100 of FIG. 1.

Figure 23:
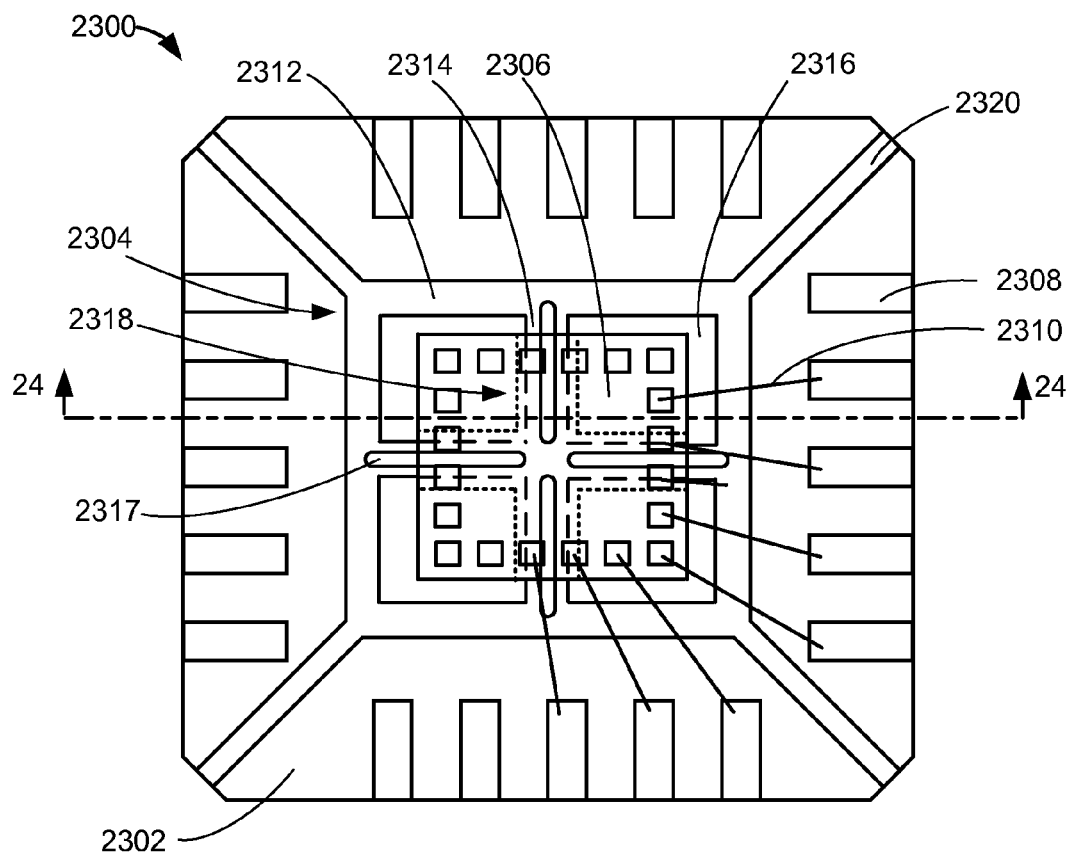
FIG. 23 is a plan view of an integrated circuit package system in a sixth embodiment of the present invention.

Referring now to FIG. 23, therein is shown a plan view of an integrated circuit package system 2300 in a sixth embodiment of the present invention. The plan view depicts the integrated circuit package system 2300 without a top portion of an encapsulation 2302, such as an epoxy molding compound. The plan view depicts a paddle 2304, an integrated circuit die 2306, external interconnects 2308, and internal interconnects 2310. The internal interconnects 2310 connect the integrated circuit die 2306 and the external interconnects 2308.

The paddle 2304, such as a die-attach paddle, preferably includes a perimeter portion 2312 and support elements 2314. As an example, the perimeter portion 2312 is shown in a rectangular ring geometric configuration. The support elements 2314 are preferably orthogonal to each other and attached to the perimeter portion 2312. For illustrative purposes, the paddle 2304 is shown having the perimeter portion 2312 as a contiguous portion, although it is understood that the perimeter portion 2312 may not be contiguous, such as segments in the perimeter portion 2312.

The paddle 2304 has gaps 2316 between the perimeter portion 2312 and the support elements 2314. The gaps 2316 serve multiple functions. For example, the gaps 2316 provide spaces for the integrated circuit die 2306, to be described in more detail later. The paddle 2304 having the gaps 2316 function as mold locking features for reducing or eliminating delamination between the paddle 2304 and the encapsulation 2302. The mold locking features help to improve reliability of the integrated circuit package system 2300 such as in moisture sensitivity level (MSL) test.

The paddle 2304 also has slots 2317 along the support elements 2314 extending to the perimeter portion 2312. The slots 2317 do not traverse through the intersection of the support elements 2314. The slots 2317 in the paddle 2304 also allow the paddle 2304 to function as mold locking features further improving performance in MSL test. The encapsulation 2302 may flow through the slots 2317 and fills the slots 2317.

The integrated circuit die 2306 mounts over and partially within the paddle 2304. The support elements 2314 are below the integrated circuit die 2306 and partially nesting the integrated circuit die 2306 within the gaps 2316. The support elements 2314 under the integrated circuit die 2306 are depicted as dotted lines continuing from the support elements 2314 not under the integrated circuit die 2306.

The integrated circuit die 2306 has interference-fit features 2318, such as channels or grooves, allowing the support elements 2314 to be partially nested within the integrated circuit die 2306. The interference-fit features 2318 are depicted as dotted lines under the integrated circuit die 2306, wherein the dotted lines representing the interference-fit features 2318 are wider than the dotted lines representing the support elements 2314.

The integrated circuit die 2306 preferably flexes or deforms allowing the support elements 2314 to fit into the interference-fit features 2318 without causing adverse damage to the integrated circuit die 2306. For illustrative purposes, the integrated circuit die 2306 is shown not overhanging the perimeter portion 2312, although it is understood that the integrated circuit die 2306 may overhang the perimeter portion 2312.

The interference-fit features 2318 preferably help secure the integrated circuit die 2306 without requiring an adhesive (not shown), such as an epoxy adhesive, for mounting the integrated circuit die 2306 over the support elements 2314. Delamination is reduced or eliminated by the reduced surface area between the integrated circuit die 2306 and the support elements 2314 compared to an entire horizontal side of the integrated circuit die 2306 in contact with the same surface area of another paddle (not shown) not having the perimeter portion 2312, the support elements 2314, and the gaps 2316. The fitting, snap fitting, interference fitting, or resistance fitting of the integrated circuit die 2306 and the support elements 2314 reduce manufacturing complexity and cost in a number ways, such as eliminating the die-attach adhesive.

The internal interconnects 2310, such a bond wires or ribbon bonds, connect the integrated circuit die 2306 and the external interconnects 2308, such as leads. Tie bars 2320 extend from corners of the paddle 2304. The encapsulation 2302 outlines the boundary of the integrated circuit package system 2300.

Figure 24:
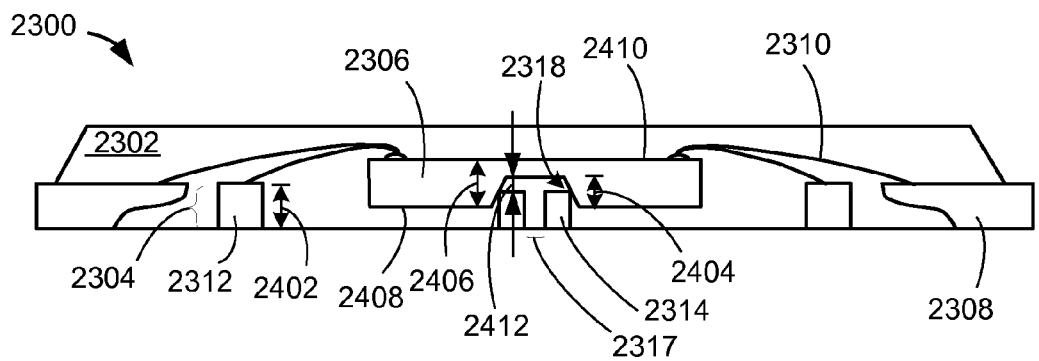
FIG. 24 is a cross-sectional view of the integrated circuit package system of FIG. 23 along line 24-24.

Referring now to FIG. 24, therein is shown a cross-sectional view of the integrated circuit package system 2300 of FIG. 23 along line 23-23. The cross-sectional view depicts the paddle 2304 having a paddle height 2402. The integrated circuit die 2306 is shown partially nested within the paddle 2304 by a fitting depth 2404 of the interference-fit features 2318.

The integrated circuit die 2306 has a thickness 2406 and the fitting depth 2404 is preferably less than the thickness 2406. The interference-fit features 2318 preferably do not traverse between a non-active side 2408 and an active side 2410 of the integrated circuit die 2306. The partially nesting of the integrated circuit die 2306 within the paddle 2304 allows for a lower profile or lower height of the integrated circuit package system 2300.

The cross-sectional view also depicts the integrated circuit die 2306 over the support elements 2314 and within the perimeter portion 2312. The interference-fit features 2318 may be formed with different geometric configurations. For example, the interference-fit features 2318 are shown as an angled geometric configuration with the wider portion of the interference-fit features 2318 is at the non-active side 2408.

A clearance 2412 is preferably between the integrated circuit die 2306 in the interference-fit features 2318 and the support elements 2314. The encapsulation 2302 preferably fills the clearance 2412. Similarly, the encapsulation 2302 also fills the slots 2317 in the paddle 2304.

For illustrative purposes, the perimeter portion 2312 and the support elements 2314 are shown similar or substantially the same height as the external interconnects 2308, although it is understood that the perimeter portion 2312, the support elements 2314, and the external interconnects 2308 may have different heights. For example, the perimeter portion 2312 and the support elements 2314 having similar or substantially the same height may be exposed by the encapsulation 2302. Another example, the perimeter portion 2312 and the support elements 2314 may be partially etched such that the perimeter portion 2312 and the support elements 2314 are within the encapsulation 2302.

The internal interconnects 2310 preferably connect the integrated circuit die 2306 with both the paddle 2304 and the external interconnects 2308. The encapsulation 2302 covers the integrated circuit die 2306 and the internal interconnects 2310. The encapsulation 2302 partially covers and exposes the external interconnects 2308 and the paddle 2304 to ambient. For illustrative purposes, the encapsulation 2302 is shown exposing the paddle 2304, although it is understood that the paddle 2304 may not be exposed.

Figure 25:
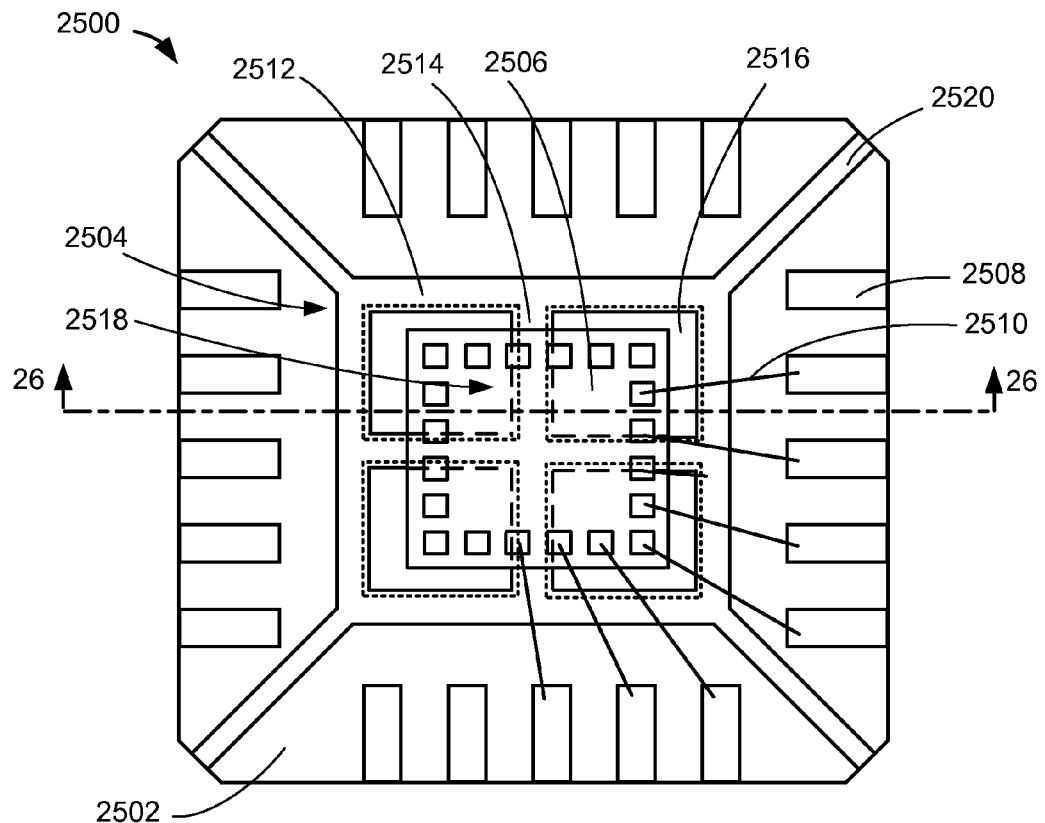
FIG. 25 is a plan view of an integrated circuit package system in a seventh embodiment of the present invention.

Referring now to FIG. 25, therein is shown a plan view of an integrated circuit package system 2500 in a seventh embodiment of the present invention. The plan view depicts the integrated circuit package system 2500 without a top portion of an encapsulation 2502, such as an epoxy molding compound. The plan view depicts a paddle 2504, an integrated circuit die 2506, external interconnects 2508, and internal interconnects 2510. The internal interconnects 2510 connect the integrated circuit die 2506 and the external interconnects 2508.

The paddle 2504, such as a die-attach paddle, preferably includes a perimeter portion 2512 and support elements 2514. As an example, the perimeter portion 2512 is shown in a rectangular ring geometric configuration. The support elements 2514 are preferably orthogonal to each other and attached to the perimeter portion 2512. For illustrative purposes, the paddle 2504 is shown having the perimeter portion 2512 as a contiguous portion, although it is understood that the perimeter portion 2512 may not be contiguous, such as segments in the perimeter portion 2512.

The paddle 2504 has gaps 2516 between the perimeter portion 2512 and the support elements 2514. The gaps 2516 serve multiple functions. For example, the gaps 2516 provide spaces for the integrated circuit die 2506, to be described in more detail later. The paddle 2504 having the gaps 2516 function as mold locking features for reducing or eliminating delamination between the paddle 2504 and the encapsulation 2502. The mold locking features help to improve reliability of the integrated circuit package system 2500 such as in moisture sensitivity level (MSL) test.

The integrated circuit die 2506 mounts over and partially within the paddle 2504. The support elements 2514 are below the integrated circuit die 2506 and partially nesting the integrated circuit die 2506 within the gaps 2516. The support elements 2514 under the integrated circuit die 2506 are depicted as dotted lines narrower than the support elements 2514 not under the integrated circuit die 2506.

The integrated circuit die 2506 has interference-fit features 2518, such as channels or grooves, allowing the support elements 2514 to be partially nested within the integrated circuit die 2506. The interference-fit features 2518 are depicted as dotted lines under the integrated circuit die 2506, wherein the dotted lines representing the interference-fit features 2518 are wider than the dotted lines representing the support elements 2514.

The integrated circuit die 2506 preferably flexes or deforms allowing the support elements 2514 to fit into the interference-fit features 2518 without causing adverse damage to the integrated circuit die 2506. For illustrative purposes, the integrated circuit die 2506 is shown not overhanging the perimeter portion 2512, although it is understood that the integrated circuit die 2506 may overhang the perimeter portion 2512.

The interference-fit features 2518 preferably help secure the integrated circuit die 2506 without requiring an adhesive (not shown), such as an epoxy adhesive, for mounting the integrated circuit die 2506 over the support elements 2514. Delamination is reduced or eliminated by the reduced surface area between the integrated circuit die 2506 and the support elements 2514 compared to an entire horizontal side of the integrated circuit die 2506 in contact with the same surface area of another paddle (not shown) not having the perimeter portion 2512, the support elements 2514, and the gaps 2516. The fitting, snap fitting, interference fitting, or resistance fitting of the integrated circuit die 2506 and the support elements 2514 reduce manufacturing complexity and cost in a number ways, such as eliminating the die-attach adhesive.

The internal interconnects 2510, such a bond wires or ribbon bonds, connect the integrated circuit die 2506 and the external interconnects 2508, such as leads. Tie bars 2520 extend from corners of the paddle 2504. The encapsulation 2502 outlines the boundary of the integrated circuit package system 2500.

Figure 26:
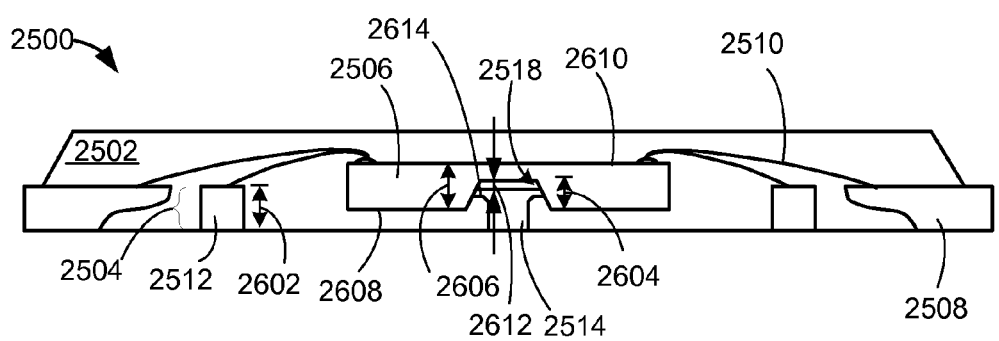
FIG. 26 is a cross-sectional view of the integrated circuit package system of FIG. 25 along line 26-26.

Referring now to FIG. 26, therein is shown a cross-sectional view of the integrated circuit package system 2500 of FIG. 25 along line 26-26. The cross-sectional view depicts the paddle 2504 having a paddle height 2602. The integrated circuit die 2506 is shown partially nested within the paddle 2504 by a fitting depth 2604 of the interference-fit features 2518.

The integrated circuit die 2506 has a thickness 2606 and the fitting depth 2604 is preferably less than the thickness 2606. The interference-fit features 2518 preferably do not traverse between a non-active side 2608 and an active side 2610 of the integrated circuit die 2506. The partially nesting of the integrated circuit die 2506 within the paddle 2504 allows for a lower profile or lower height of the integrated circuit package system 2500.

The cross-sectional view also depicts the integrated circuit die 2506 over the support elements 2514 and within the perimeter portion 2512. The interference-fit features 2518 may be formed with different geometric configurations. For example, the interference-fit features 2518 are shown as an angled geometric configuration with the wider portion of the interference-fit features 2518 is at the non-active side 2608. A clearance 2612 is preferably between the integrated circuit die 2506 in the interference-fit features 2518 and the support elements 2514. The encapsulation 2502 preferably fills the clearance 2612.

Further, the cross-sectional view depicts the support elements 2514 having a deformable portion 2614 inside the interference-fit features 2518. The deformable portion 2614 may be formed in a number of ways, such as partially etching the support elements 2514 from the portion of the support elements 2514 not in the interference-fit features 2518. The deformable portion 2614 may deform in the interference-fit features 2518 avoiding damage to the integrated circuit die 2506.

For illustrative purposes, the perimeter portion 2512 and the support elements 2514 are shown similar or substantially the same height as the external interconnects 2508, although it is understood that the perimeter portion 2512, the support elements 2514, and the external interconnects 2508 may have different heights. For example, the perimeter portion 2512 and the support elements 2514 having similar or substantially the same height may be exposed by the encapsulation 2502. Another example, the perimeter portion 2512 and the support elements 2514 may be partially etched such that the perimeter portion 2512 and the support elements 2514 are within the encapsulation 2502.

The internal interconnects 2510 preferably connect the integrated circuit die 2506 with both the paddle 2504 and the external interconnects 2508. The encapsulation 2502 covers the integrated circuit die 2506 and the internal interconnects 2510. The encapsulation 2502 partially covers and exposes the external interconnects 2508 and the paddle 2504 to ambient. For illustrative purposes, the encapsulation 2502 is shown exposing the paddle 2504, although it is understood that the paddle 2504 may not be exposed.

Figure 27:
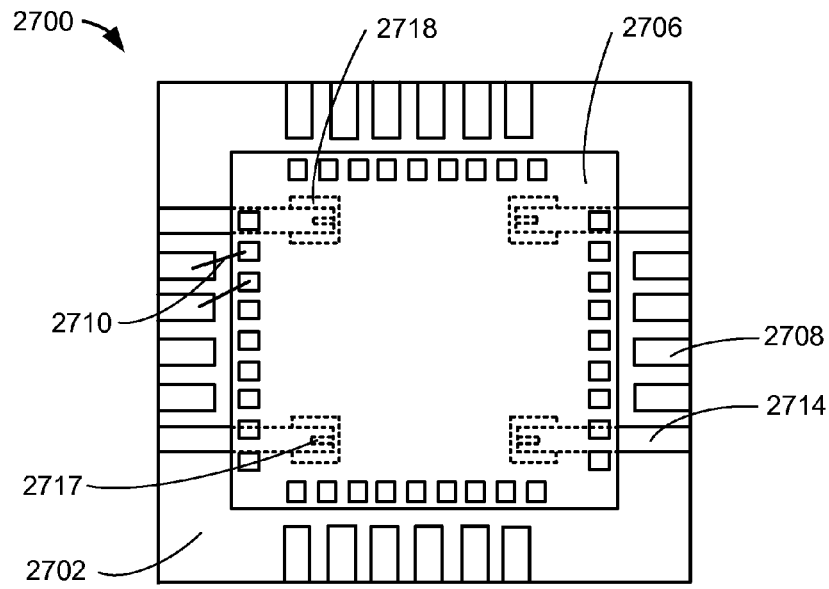
FIG. 27 is a plan view of an integrated circuit package system in an eighth embodiment of the present invention.

Referring now to FIG. 27, therein is shown a plan view of an integrated circuit package system 2700 in an eighth embodiment of the present invention. The plan view depicts the integrated circuit package system 2700 without a top portion of an encapsulation 2702, such as an epoxy molding compound. The plan view depicts an integrated circuit die 2706, support elements 2714, external interconnects 2708, and internal interconnects 2710. Each of the support elements 2714 includes a slot 2717, such as a linear slit. The internal interconnects 2710 connect the integrated circuit die 2706 and the external interconnects 2708. The plan view also depicts the integrated circuit package system 2700 as padless or not having a paddle (not shown).

The integrated circuit die 2706 mounts over the support elements 2714, such as extended leads. The support elements 2714 are below the integrated circuit die 2706 and partially nesting in the integrated circuit die 2706. The integrated circuit die 2706 has interference-fit features 2718, such as recesses or grooves, represented by dotted lines that allow the support elements 2714 to be partially nested within the integrated circuit die 2706. The slot 2717 is shown within the dotted boundary of the interference-fit features 2718.

The interference-fit features 2718 preferably help secure the integrated circuit die 2706 without requiring an adhesive (not shown), such as an epoxy adhesive, for mounting the integrated circuit die 2706 over the support elements 2714. Delamination is reduced or eliminated by the reduced surface area between the integrated circuit die 2706 and the support elements 2714 compared to an entire horizontal side of the integrated circuit die 2706 in contact with the same surface area of a paddle (not shown). The fitting or snap fitting of the integrated circuit die 2706 and the support elements 2714 reduces manufacturing complexity and cost in a number ways, such as eliminating the die-attach adhesive.

For illustrative purposes, the interference-fit features 2718 are shown substantially the same, although it is understood that the interference-fit features 2718 may be different, such as different sizes or at different locations of the integrated circuit die 2706. Also for illustrative purposes, the support elements 2714 are shown substantially the same, although it is understood that the support elements 2714 may be different, such as different sizes or lengths.

The internal interconnects 2710, such a bond wires or ribbon bonds, connect the integrated circuit die 2706 and the external interconnects 2708, such as leads. The encapsulation 2702 outlines the boundary of the integrated circuit package system 2700.

Figure 28:
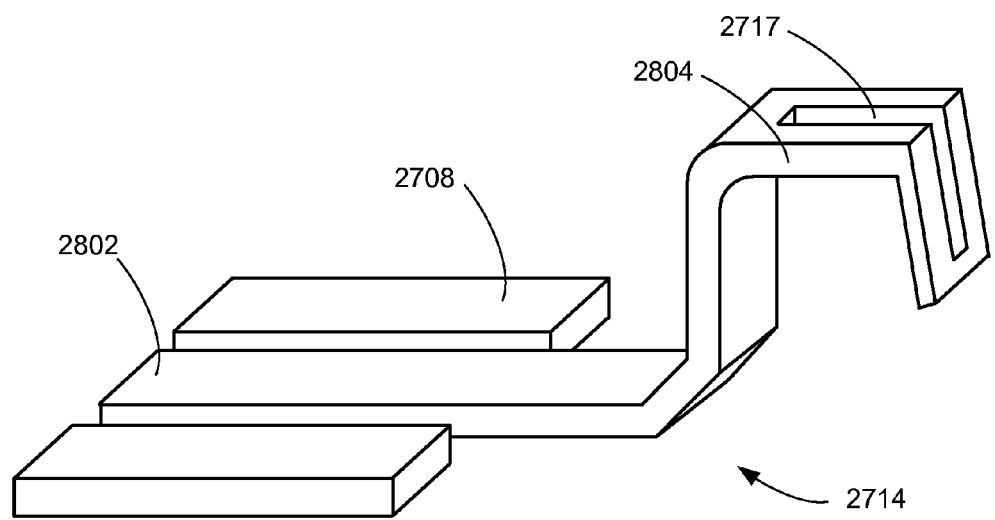
FIG. 28 is an isometric view of one of the support elements of FIG. 27.

Referring now to FIG. 28, therein is shown an isometric view of one of the support elements 2714 of FIG. 27. The isometric view depicts one of the support elements 2714 between the external interconnects 2708, such as leads. A planar portion 2802 of the support elements 2714 may or may not be coplanar to the external interconnects 2708. For example, the support elements 2714 may be partially or half-etched such that the encapsulation 2702 of FIG. 27 does not expose the support elements 2714 to ambient.

A locking portion 2804 of the support elements 2714 preferably has the resilient bend for providing a secure and non-adhesive fit into the interference-fit features 2718 of FIG. 27. The slot 2717 is preferably in the locking portion 2804 providing a channel for mold flow and is preferably filled with the encapsulation 2702 of FIG. 27.

Figure 29:
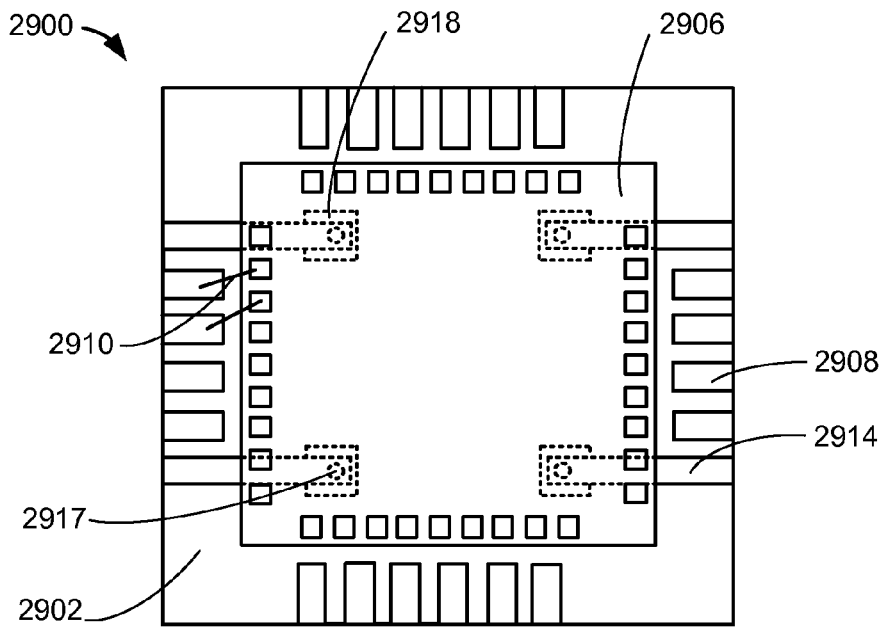
FIG. 29 is a plan view of an integrated circuit package system in a ninth embodiment of the present invention.

Referring now to FIG. 29, therein is shown a plan view of an integrated circuit package system 2900 in a ninth embodiment of the present invention. The plan view depicts the integrated circuit package system 2900 without a top portion of an encapsulation 2902, such as an epoxy molding compound. The plan view depicts an integrated circuit die 2906, support elements 2914, external interconnects 2908, and internal interconnects 2910. Each of the support elements 2914 includes a slot 2917, such as a through hole. The internal interconnects 2910 connect the integrated circuit die 2906 and the external interconnects 2908. The plan view also depicts the integrated circuit package system 2900 as padless or not having a paddle (not shown).

The integrated circuit die 2906 mounts over the support elements 2914, such as extended leads. The support elements 2914 are below the integrated circuit die 2906 and partially nesting in the integrated circuit die 2906. The integrated circuit die 2906 has interference-fit features 2918, such as recesses or grooves, represented by dotted lines that allow the support elements 2914 to be partially nested within the integrated circuit die 2906. The slot 2917 is shown within the dotted boundary of the interference-fit features 2918.

The interference-fit features 2918 preferably help secure the integrated circuit die 2906 without requiring an adhesive (not shown), such as an epoxy adhesive, for mounting the integrated circuit die 2906 over the support elements 2914. Delamination is reduced or eliminated by the reduced surface area between the integrated circuit die 2906 and the support elements 2914 compared to an entire horizontal side of the integrated circuit die 2906 in contact with the same surface area of a paddle (not shown). The fitting or snap fitting of the integrated circuit die 2906 and the support elements 2914 reduces manufacturing complexity and cost in a number ways, such as eliminating the die-attach adhesive.

For illustrative purposes, the interference-fit features 2918 are shown substantially the same, although it is understood that the interference-fit features 2918 may be different, such as different sizes or at different locations of the integrated circuit die 2906. Also for illustrative purposes, the support elements 2914 are shown substantially the same, although it is understood that the support elements 2914 may be different, such as different sizes or lengths.

The internal interconnects 2910, such a bond wires or ribbon bonds, connect the integrated circuit die 2906 and the external interconnects 2908, such as leads. The encapsulation 2902 outlines the boundary of the integrated circuit package system 2900.

Figure 30:
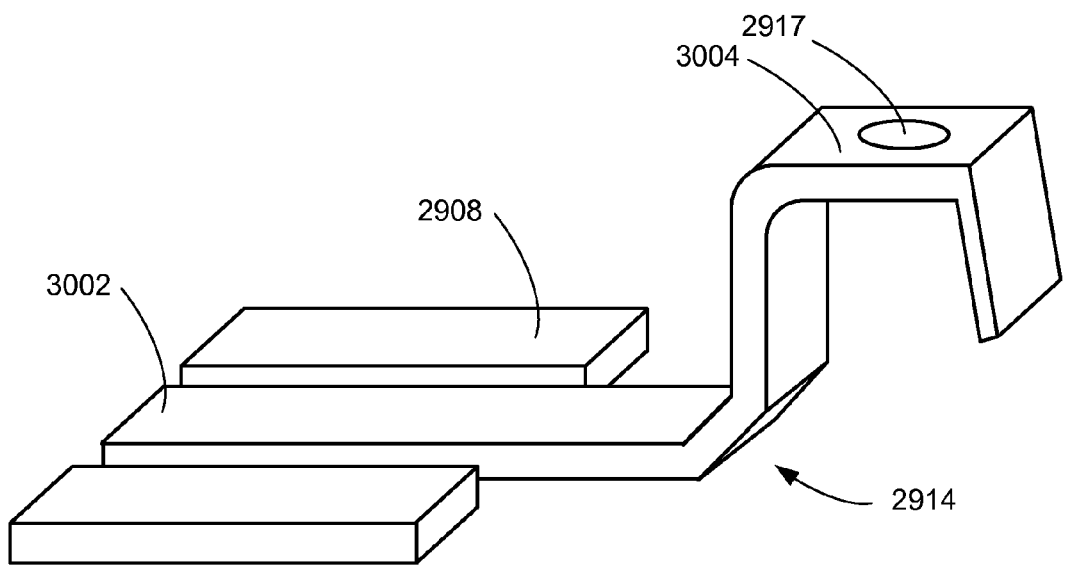
FIG. 30 is an isometric view of one of the support elements of FIG. 29.

Referring now to FIG. 30, therein is shown an isometric view of one of the support elements 2914 of FIG. 29. The isometric view depicts one of the support elements 2914 between the external interconnects 2908, such as leads. A planar portion 3002 of the support elements 2914 may or may not be coplanar to the external interconnects 2908. For example, the support elements 2914 may be partially or half etched such that the encapsulation 2902 does not expose the support elements 2914 to ambient.

A locking portion 3004 of the support elements 2914 preferably has the resilient bend for providing a secure and non-adhesive fit into the interference-fit features 2918 of FIG. 29. The slot 2917 is preferably in the locking portion 3004 providing a channel for mold flow and is preferably filled with the encapsulation 2902 of FIG. 29.

Figure 31:
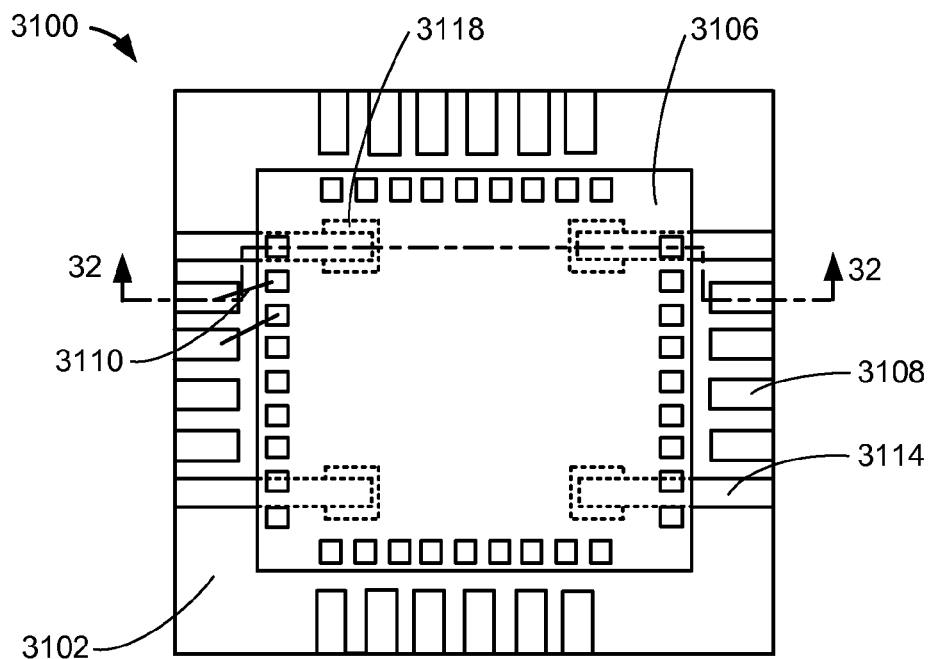
FIG. 31 is a plan view of an integrated circuit package system in a tenth embodiment of the present invention.

Referring now to FIG. 31, therein is shown a plan view of an integrated circuit package system 3100 in a tenth embodiment of the present invention. The plan view depicts the integrated circuit package system 3100 without a top portion of an encapsulation 3102, such as an epoxy molding compound. The plan view depicts an integrated circuit die 3106, support elements 3114, external interconnects 3108, and internal interconnects 3110. The internal interconnects 3110 connect the integrated circuit die 3106 and the external interconnects 3108. The plan view also depicts the integrated circuit package system 3100 as padless or not having a paddle (not shown).

The integrated circuit die 3106 mounts over the support elements 3114, such as extended leads. The support elements 3114 are below the integrated circuit die 3106 and partially nesting in the integrated circuit die 3106. The integrated circuit die 3106 has interference-fit features 3118, such as recesses or grooves, represented by dotted lines that allow the support elements 3114 to be partially nested within the integrated circuit die 3106.

The interference-fit features 3118 preferably help secure the integrated circuit die 3106 without requiring an adhesive (not shown), such as an epoxy adhesive, for mounting the integrated circuit die 3106 over the support elements 3114. Delamination is reduced or eliminated by the reduced surface area between the integrated circuit die 3106 and the support elements 3114 compared to an entire horizontal side of the integrated circuit die 3106 in contact with the same surface area of a paddle (not shown). The fitting or snap fitting of the integrated circuit die 3106 and the support elements 3114 reduces manufacturing complexity and cost in a number ways, such as eliminating the die-attach adhesive.

For illustrative purposes, the interference-fit features 3118 are shown substantially the same, although it is understood that the interference-fit features 3118 may be different, such as different sizes or at different locations of the integrated circuit die 3106. Also for illustrative purposes, the support elements 3114 are shown substantially the same, although it is understood that the support elements 3114 may be different, such as different sizes or lengths.

The internal interconnects 3110, such a bond wires or ribbon bonds, connect the integrated circuit die 3106 and the external interconnects 3108, such as leads. The encapsulation 3102 outlines the boundary of the integrated circuit package system 3100.

Figure 32:
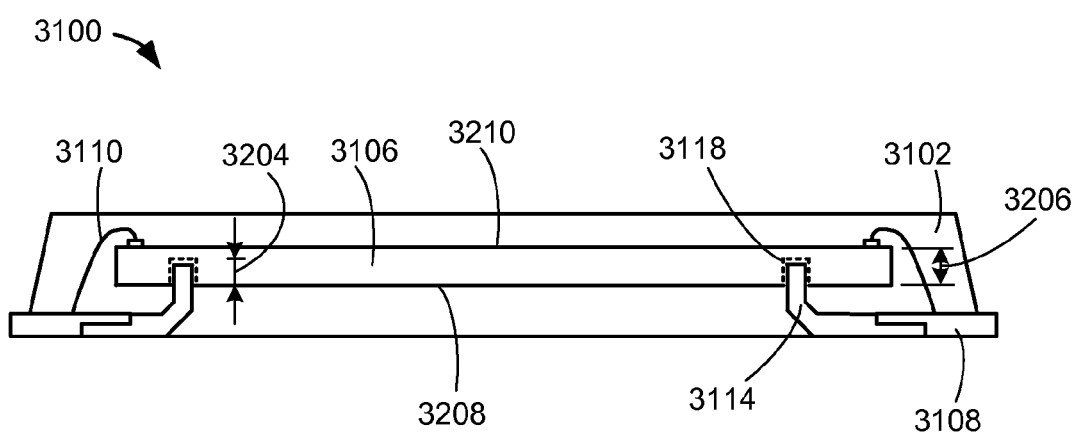
FIG. 32 is a cross-sectional view of the integrated circuit package system of FIG. 31 along line 32-32.

Referring now to FIG. 32, therein is a cross-sectional view of the integrated circuit package system 3100 of FIG. 31 along line 31-31. The cross-sectional view depicts the integrated circuit die 3106 is shown partially nesting the support elements 3114 by a fitting depth 3204 of the interference-fit features 3118. The integrated circuit die 3106 preferably flexes or deforms allowing the support elements 3114 to fit into the interference-fit features 3118 without causing adverse damage to the integrated circuit die 3106. The interference-fit features 3118 are depicted by dotted lines. The support elements 3114 preferably further extend towards center or interior of the integrated circuit package system 3100 than the external interconnects 3108.

The integrated circuit die 3106 has a thickness 3206 and the fitting depth 3204 is preferably less than the thickness 3206. The interference-fit features 3118 preferably do not traverse between a non-active side 3208 and an active side 3210 of the integrated circuit die 3106. The partially nesting of the support elements 3114 within the integrated circuit die 3106 allows for a lower profile or lower height of the integrated circuit package system 3100.

The internal interconnects 3110 preferably connect the integrated circuit die 3106 and the external interconnects 3108. The encapsulation 3102 covers the integrated circuit die 3106 and the internal interconnects 3110. The encapsulation 3102 partially covers and exposes the external interconnects 3108 and the support elements 3114 to ambient.

For illustrative purposes, the encapsulation 3102 is shown exposing the support elements 3114, although it is understood that the support elements 3114 may not be exposed. For example, the support elements 3114 may be partially or half etched such that the encapsulation 3102 does not expose the support elements 3114 to ambient.

Figure 33:
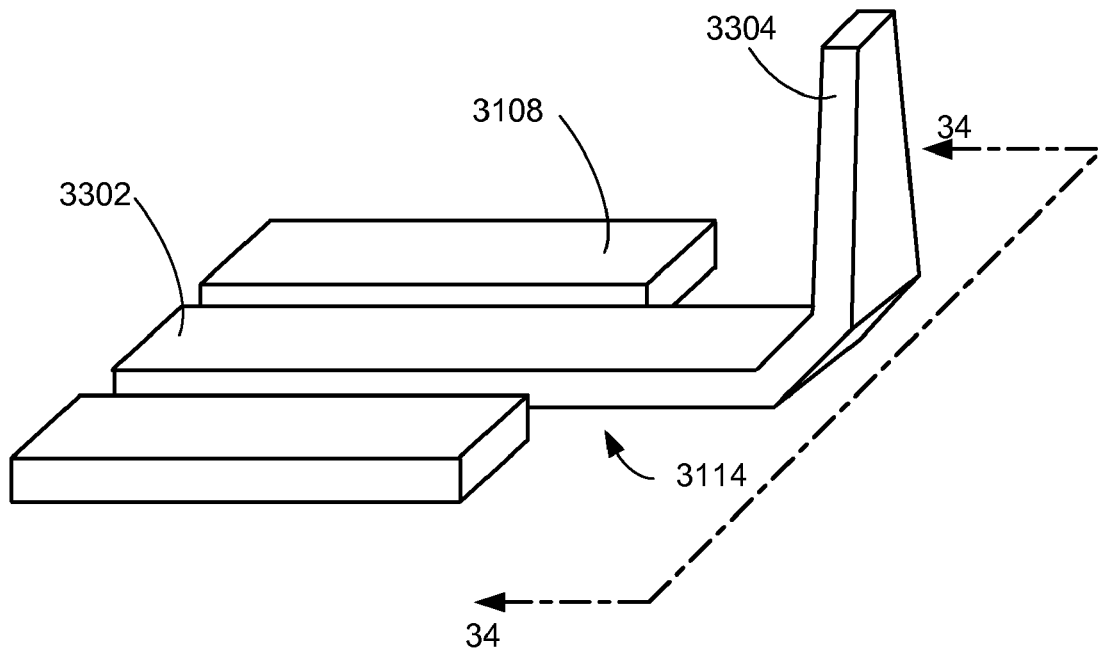
FIG. 33 is an isometric view of one of the support elements of FIG. 32.

Referring now to FIG. 33, therein is shown an isometric view of one of the support elements 3114 of FIG. 32. The isometric view depicts one of the support elements 3114 between the external interconnects 3108, such as leads. A planar portion 3302 of the support elements 3114 may or may not be coplanar to the external interconnects 3108. For example, the support elements 3114 may be partially or half etched. A locking portion 3304 of the support elements 3114 preferably has the resilient tip for providing a secure and non-adhesive fit into the interference-fit features 3118 of FIG. 32.

Figure 34:
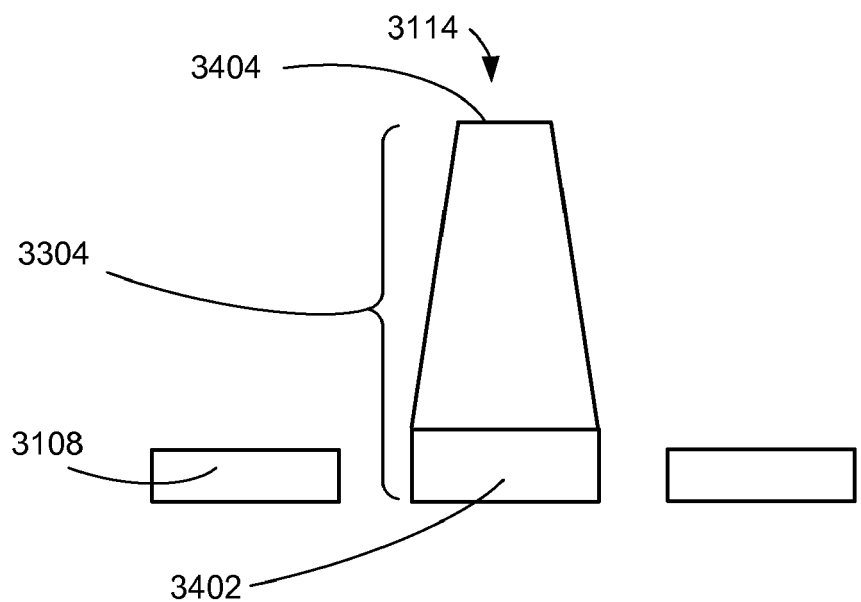
FIG. 34 is a cross-sectional view of one of the support elements of FIG. 33 along line 34-34.

Referring now to FIG. 34, therein is shown a cross-sectional view of one of the support elements 3114 of FIG. 33 along line 34-34. The cross-sectional view depicts one of the support elements 3114 between the external interconnects 3108. The locking portion 3304 may be formed in a number of geometric configurations. For example, the locking portion 3304 may have a wedge geometric configuration with a base 3402 of the locking portion 3304 extending from the planar portion 3302 of FIG. 33 is wider than a tip 3404 of the locking portion 3304. The wedge geometric configuration of the locking portion 3304 allows the support elements 3114 to form interference fit with the interference-fit features 3118 of FIG. 32 of the integrated circuit die 3106 of FIG. 32.

Figure 35:
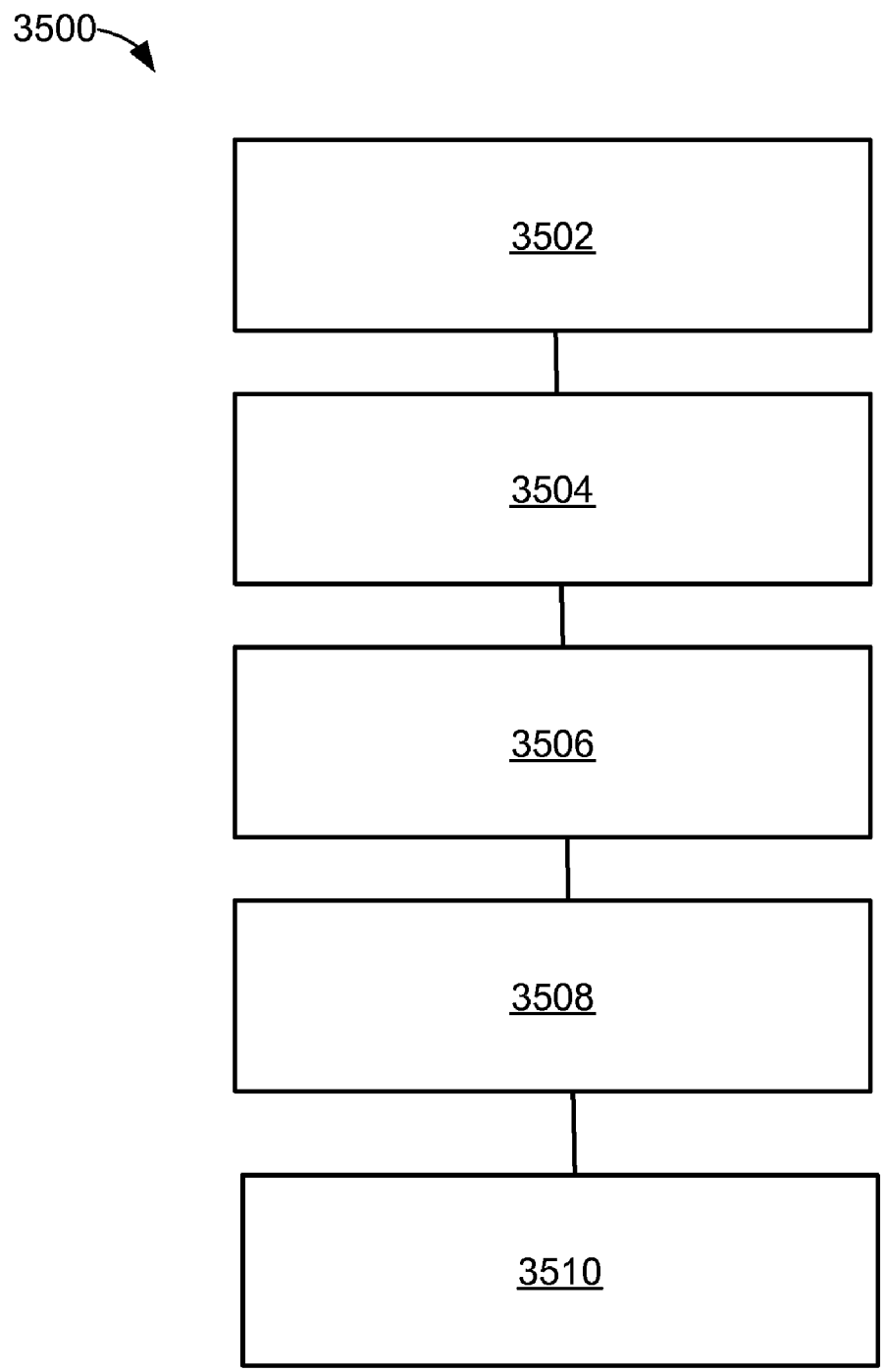
FIG. 35 is a flow chart of an integrated package system for manufacturing the integrated circuit package system in an embodiment of the present invention.

Referring now to FIG. 35, therein is shown a flow chart of an integrated circuit package system 3500 for manufacturing the integrated circuit package system 100 in an embodiment of the present invention. The system 3500 includes forming an integrated circuit die in a block 3502; forming an interference-fit feature in the integrated circuit die in a block 3504; fitting a support element within the interference-fit feature in a block 3506; connecting an external interconnect and the integrated circuit die in a block 3508; and encapsulating the integrated circuit die in a block 3510.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
    forming an integrated circuit die;
    forming an interference-fit feature in the integrated circuit die;
    forming a paddle having a support element and a tie bar;
    fitting the support element within the interference-fit feature;
    connecting an external interconnect and the integrated circuit die; and
    encapsulating the integrated circuit die.

2. The method as claimed in claim 1 wherein forming the paddle includes forming the paddle having a gap between a perimeter portion and the support element.

3. The method as claimed in claim 1 wherein forming the interference-fit feature includes forming a recess in a non-active side of the integrated circuit die.

4. The method as claimed in claim 1 further comprising forming the support element adjacent to the external interconnect.

5. The method as claimed in claim 1 further comprising forming the support element having a planar portion and a locking portion.

6. A method for manufacturing an integrated circuit package system comprising:
    forming an integrated circuit die having a non-active side and an active side;
    forming an interference-fit feature in the integrated circuit die from the non-active side;
    forming a paddle having a support element and a tie bar;
    fitting the support element within the interference-fit feature without an adhesive;
    connecting an external interconnect and the active side; and
    encapsulating the integrated circuit die.

7. The method as claimed in claim 6 wherein forming the paddle includes forming a perimeter portion and a slot through the paddle.

8. The method as claimed in claim 6 further comprising:
    forming the support element having a planar portion and a locking portion; and wherein forming the locking portion includes:
    forming a slot through the locking portion.

9. The method as claimed in claim 6 further comprising:
    forming the support element having a planar portion and a locking portion; and wherein forming the locking portion includes:

forming a tip and a base extending from the planar portion.

10. The method as claimed in claim 6 wherein fitting the support element within the interference-fit feature further includes mounting the integrated circuit die over the support element.

11. An integrated circuit package system comprising:
an integrated circuit die having an interference-fit feature;
a paddle having a support element and a tie bar extending from a corner of the paddle and with the support element within the interference-fit feature;
an external interconnect connected with the integrated circuit die; and
an encapsulation over the integrated circuit die.

12. The system as claimed in claim 11 wherein the paddle includes a gap between a perimeter portion and the support element.

13. The system as claimed in claim 11 wherein the interference-fit feature includes a recess in a non-active side of the integrated circuit die.

14. The system as claimed in claim 11 wherein the support element is adjacent to the external interconnect.

15. The system as claimed in claim 11 wherein the support element includes a planar portion and a locking portion.

16. The system as claimed in claim 11 wherein:
the integrated circuit die includes a non-active side and an active side with the interference-fit feature from the non-active side; and
the encapsulation is partially over the support element.

17. The system as claimed in claim 16 wherein the support element includes the paddle having a slot.

18. The system as claimed in claim 16 wherein the support element includes a planar portion and a locking portion having a slot.

19. The system as claimed in claim 16 wherein the support element includes a planar portion and a locking portion with the locking portion having a tip and a base extending from the planar portion.

20. The system as claimed in claim 16 wherein the support element within the interference-fit feature includes the integrated circuit die over the support element.

* * * * *